(12) United States Patent
Gupta et al.

(10) Patent No.: US 7,313,199 B2
(45) Date of Patent: Dec. 25, 2007

(54) POWER AMPLIFIER LINEARIZATION

(75) Inventors: Deepnarayan Gupta, Hawthorne, NY (US); Oleg A. Mukhanov, Putnam Valley, NY (US)

(73) Assignee: Hypres, Inc., Elmsford, NY (US)

( * ) Notice: Subject to any disclaimer, the term of this patent is extended or adjusted under 35 U.S.C. 154(b) by 699 days.

(21) Appl. No.: 10/357,130

(22) Filed: Feb. 3, 2003

(65) Prior Publication Data

US 2003/0179831 A1 Sep. 25, 2003

Related U.S. Application Data

(60) Provisional application No. 60/366,360, filed on Mar. 21, 2002, provisional application No. 60/366,466, filed on Mar. 21, 2002.

(51) Int. Cl.
*H04L 25/49* (2006.01)
*H04B 15/00* (2006.01)

(52) U.S. Cl. .................. 375/297; 375/296; 375/285; 375/219

(58) Field of Classification Search ............... 375/296, 375/297, 285, 219; 455/63.1, 67.11, 114.2; 341/110, 155, 159, 162
See application file for complete search history.

(56) References Cited

U.S. PATENT DOCUMENTS

| | | | | |
|---|---|---|---|---|
| 5,471,164 A | * | 11/1995 | Penny | 330/149 |
| 5,937,011 A | * | 8/1999 | Carney et al. | 375/297 |
| 5,963,106 A | * | 10/1999 | Blyth et al. | 332/109 |
| 6,154,661 A | * | 11/2000 | Goldburg | 455/562.1 |
| 6,496,062 B1 | * | 12/2002 | Nitz et al. | 330/52 |
| 6,674,808 B1 | * | 1/2004 | Griph et al. | 375/285 |
| 6,738,420 B1 | * | 5/2004 | Bradley | 375/234 |
| 7,047,264 B2 | * | 5/2006 | Kishi | 708/313 |

* cited by examiner

*Primary Examiner*—David C. Payne
*Assistant Examiner*—Linda Wong
(74) *Attorney, Agent, or Firm*—Henry I. Schanzer, Esq.

(57) ABSTRACT

A system for linearizing the output of a high power amplifier (HPA) designed to transmit an RF modulated signal includes in its transmit section a digital up-converter for processing baseband input signals and generating a desired digital RF waveform, T(s). The desired digital RF waveform T(s) is then fed to a digital predistorter circuit for producing a predistorted digital RF waveform P(s)T(s) which, as modified, may be applied via a high sampling speed high linearity digital to analog converter to the high power amplifier (HPA) to produce an output signal which is a linear function of the baseband input signal. The digital predistorter circuit may be of the adaptive type or of the predictive type. Circuits embodying the invention may include encoding circuitry for converting multi-bit signals to a serial stream of single-bit pulses for enabling simplification in the digital to analog conversion. In accordance with the invention, corrections for non-linearity of the HPA may be made directly on the RF waveform using ultra-high speed superconducting electronics (SCE) and decreasing the time delay between sensing a transmitted signal and generating a correcting (linearizing) signal.

30 Claims, 22 Drawing Sheets

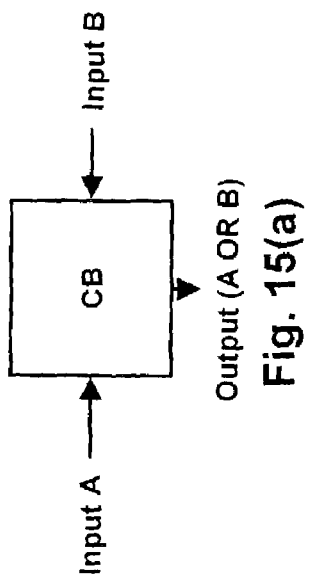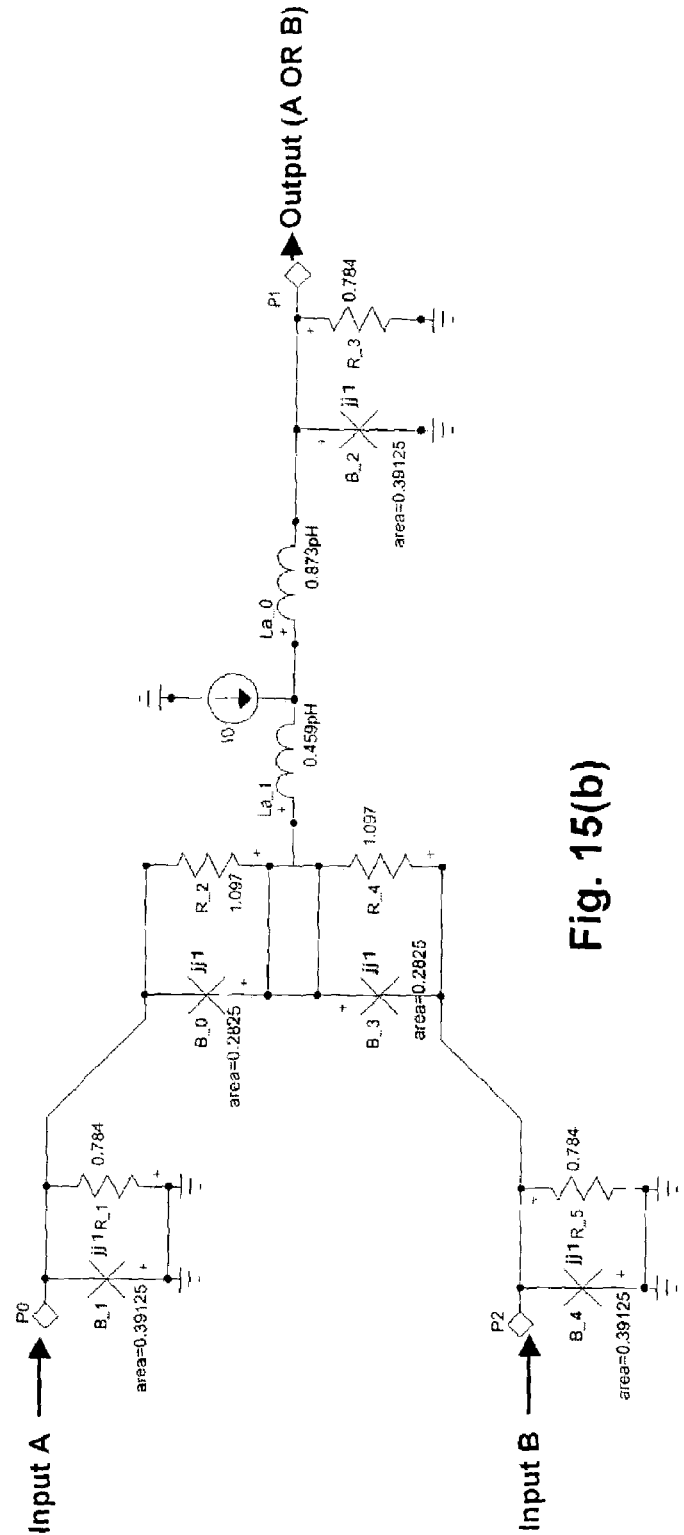

POWER AMPLIFIER LINEARIZATION

CROSS REFERENCE TO RELATED APPLICATIONS

This application claims priority from provisional application Ser. No. 60/366,360 filed Mar. 21, 2002 for METHOD AND APPARATUS FOR ADAPTIVELY LINEARIZING A POWER AMPLIFIER by Deepnarayan Gupta and Oleg A. Mukhanov and provisional application Ser. No. 60/366,466 filed Mar. 21, 2002 for DYNAMIC DIGITAL RF-PREDISTORTER FOR PREDICTIVE LINEARIZATION OF HIGH POWER AMPLIFIERS by Deepnarayan Gupta the disclosure of which is incorporated herein by reference This invention was made with Government support under contract DSAG60-02-P-0281 awarded by the U.S. Army Space and Missile Defense Command. The Government has certain rights in the invention.

BACKGROUND OF THE INVENTION

This invention relates to apparatus and methods for linearizing the response of a high power amplifier (HPA).

In both communications and radar systems, the performance of the systems is limited by the linearity (or lack thereof) of the high power amplifiers used to transmit the RF output signals. Nonlinearities in the response of the high power amplifiers create distortions that limit the dynamic range of the amplifiers. Efforts to correct this problem, decrease the amplifier efficiency while increasing the hardware complexity and cost.

In known power amplifier systems, while it is the rf waveform that gets distorted, the conventional corrective measures (such as a compensating predistortion equalizer) are applied on, and to, the baseband signals due to speed limitations of known semiconductor electronics. Such baseband schemes are fundamentally constrained to partial correction to weak nonlinearity.

A known scheme may be explained with reference to FIG. 1 which shows a prior art digital baseband predistortion correcting arrangement. Digital baseband data (Iin and Qin) are supplied to a digital pre-distorter circuit 13 whose output O13 is supplied to a digital-to-analog converter (DAC) 15 to produce an (unmodulated) output O15 which is supplied to an analog up-converter circuit 17 in which the base band signal (at O15) is modulated (by means of an analog local oscillator 18) so as to produce an output O17 which is an RF modulated signal. The RF modulated output O17 is then fed to an analog bandpass filter 19 whose output O19 is then fed to a high power amplifier (HPA) 21. A portion O21 of the HPA 21 output (which is an RF modulated signal) is fed back to an analog bandpass filter 23 whose output O23 (which is still an RF modulated signal) is supplied to an analog down-converter 25 to produce a demodulated output O25 which is fed to an analog-to-digital converter (ADC) 27 whose digitized output O27 is fed to baseband predistorter circuit 13 for determination and introduction of any needed modification and/or correction to the signal (O13) being fed via Dac 14, up-converter 17 and BPF 19 to the HPA 21. Thus, although a significant portion of the non-linearities occur in the RF section of the system, the corrections and modifications are conducted at the baseband level. This is problematic because the corrections are not directly introduced on the RF signal and there is a significant time delay between the signal sensed at the output of the HPA and the application of a corresponding signal to the baseband pre-distorter and the subsequent generation of a "pre-distorter" signal to be supplied to the HPA.

SUMMARY OF THE INVENTION

It is an object of this invention to perform corrections directly on the rf waveform for three major reasons: (1) near-perfect correction to even strong amplifier nonlinearity; (2) substantially simpler signal processing circuitry; and (3) decreasing the time delay between sensing a transmitted signal and generating a correcting (linearizing) signal.

It is a further object of this invention to employ ultra-high speed superconducting electronics (SCE) to perform digital predistortion (for correction and linearization) directly on the rf waveform to improve linearity and increase the dynamic range.

The transmit section of a system embodying the invention may include a digital filter followed by a digital up-converter for processing baseband input signals and generating a desired digital RF waveform, T(s). The desired digital RF waveform T(s) may then be fed to a digital predistorter circuit for producing a predistorted digital RF waveform P(s)T(s) which may be supplied to a high sampling speed high linearity digital-to-analog converter (DAC) whose output may be applied to a high power amplifier (HPA) to produce an output signal which is a linear function of the baseband input signal.

The digital predistorter circuit may be of the adaptive type or it may be of the predictive type. Predistorter circuits of the adaptive type may include means for sensing and sampling the desired digital RF transmit waveform [T(s)] and the output waveform from the HPA for directly adding or subtracting predistorter signals onto the RF transmit waveform. Predistorter circuits of the adaptive type may include means for sensing and sampling the transmit waveform [T(s)] and a look up table containing previously obtained and stored data, or dynamically updated data, which is used to modify (i.e., predistort) the transmit waveform T(s). Predistorter circuits of the predictive type may include a predistortion calculator which, based on the pattern of the transmit waveform and prior knowledge of the transfer function of the HPA, adds or subtracts distortion signals to a transmit waveform as it is processed in the predistorter and DAC circuitry.

In accordance with the invention, digital filters, digital up-converters, digital predistorters and the DACs may be formed using superconducting electronics. This technology paves the way for broadband, low-distortion, multi-carrier transmitters, utilizing cheaper, more efficient high power amplifiers. This results in enhanced system performance as well as lower cost and decreased operating expenses of radar and communication signal transmitters.

The transmitter system embodying the invention may be used as part of a transceiver employing superconducting electronics.

BRIEF DESCRIPTION OF THE DRAWINGS

In the accompanying drawings like reference characters denote like components.

FIGS. 15(*a*) and 15(*b*) are, respectively, the symbolic representation of a confluence buffer cell which functions as an asynchronous OR gate and its circuit schematic.

DETAILED DESCRIPTION OF THE INVENTION

Figure 1:
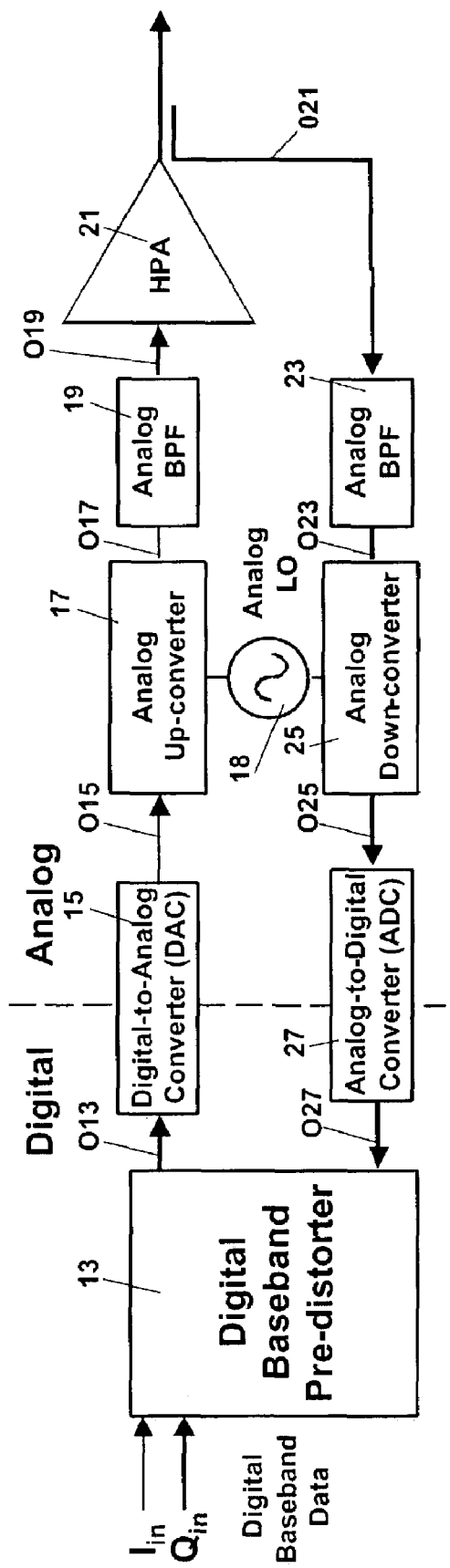
FIG. 1 is a block diagram of a PRIOR ART digital baseband predistortion circuit.
Figure 2:
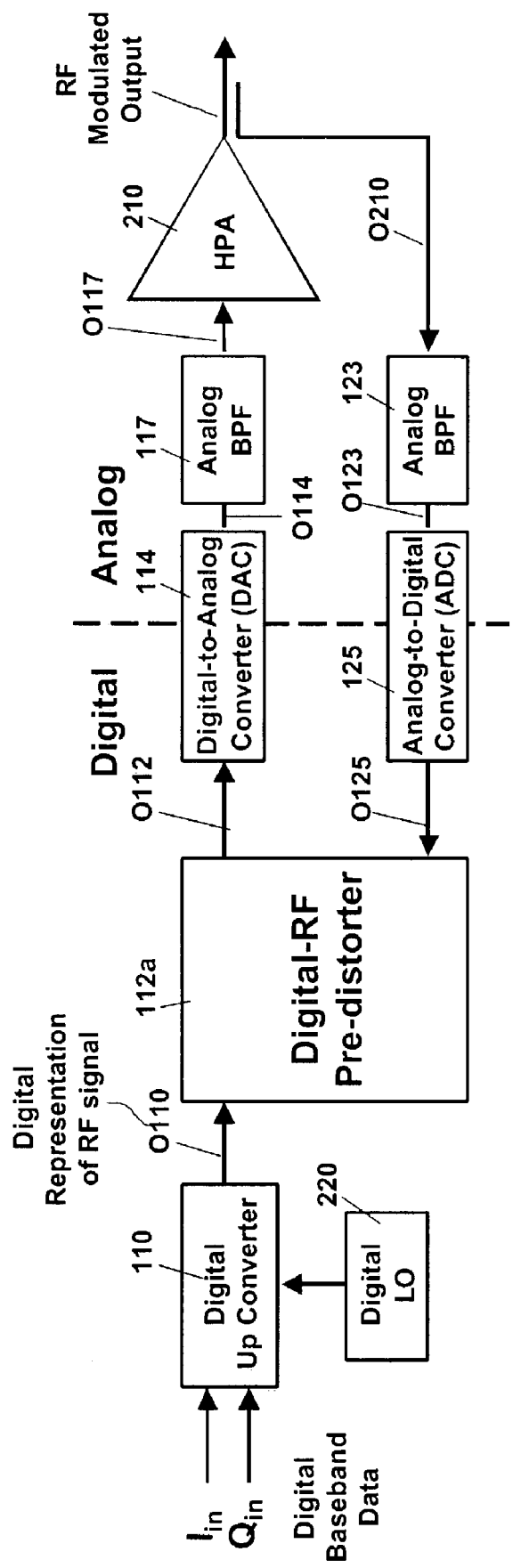
FIG. 2 is a block diagram of a digital RF predistortion circuit embodying the invention.

FIG. 2 is a general block diagram of a digital RF predistortion circuit embodying the invention. In accordance with the invention, digital baseband data signals (Iin and Qin) are supplied to a digital-up-converter (DUC) 110 which is modulated by a digital local oscillator 220. The output O110 of DUC 110 is a multi-bit RF modulated signal which is sampled at a very high rate (e.g., at more than 10 or 20 giga-samples per second, GSPS). The number of bits (for each signal sample) is normally selected to meet desired system requirements of precision and accuracy, with the precision and accuracy increasing with the number of bits. However, to handle a greater number of bits requires a corresponding increase in circuitry to handle the bits and this is often the limiting factor on the total number of bits (where the number of bits typically, but not necessarily, increase in binary fashion).

The RF modulated output O110 of up-converter 110 is fed to an input port of a digital RF predistorter 112*a* having an output port O112 at which is produced a predistorted output signal which is fed to an RF digital-to-analog converter (DAC) 114 which may include an encoder and a DAC whose output O114 is fed to an analog bandpass filter 117. The output O117 of analog BPF 117 is fed to an input port of an HPA 210 to produce an RF modulated output signal at its output port. A portion O210 of the HPA 210 output signal is fed back to an analog bandpass filter 123 whose output O123 (which is still an analog RF modulated signal) is supplied to an analog to digital converter (ADC) 125 whose output O125 is fed to a control port of digital RF predistorter 112*a*. The predistorter 112*a* includes circuitry for comparing the "RF" feedback signal at O125 to the digital "RF" input signal at O110 for determination of any needed modification and/or correction to the transmit signal being fed to the HPA 210. The function of the digital RF predistorter 112 is to digitally modify (pre-distort) the RF signals to be applied to the input port of the HPA such that the output of the HPA is a linear function of the digital baseband signals. Thus, in contrast to the prior art, the corrections in the system of FIG. 2 are conducted at the RF level.

It should be noted that one purpose of injecting predistortion signals onto a signal to be transmitted via an amplifier (e.g., HPA 210 which may introduce distortions and non-linearities) is to multiply the signal transfer function, $T(s)$, by a predistortion transfer function, $P(s)$, so that following the nonlinear amplification imparted to the signal by the HPA, the output signal becomes proportional to $T(s)$. Assume that the nonlinear gain of HPA 210 is $G(s)$. [Note: HPA 210 may represent an amplifier chain comprised of a number of cascaded amplifiers.] Ideally, an amplifier should simply scale up the signal amplitude, so that the amplified output, $A(s)=kT(s)$; where k is a constant. This is achieved if $P(s)$ is proportional to $G^{-1}(s)$. If $G(s)$ does not vary in time, the predistorter function can be realized either with a look-up table or with a digital filter to change the signal amplitude by a specified amount. This is a static predistorter. However, in real HPAs, $G(s)$ changes with time. Therefore, a dynamic predistorter is needed to track the changes of the amplifier's time varying transfer function. This can be done by converting a small fraction of the HPA output back to the digital domain, comparing it with the original digital data and calculating changes in $P(s)$ to track changes in $G(s)$. This is referred to herein as "adaptive" or "feedback" predistortion. The changes in $G(s)$ with time occur due to many factors ranging from long term drift due to component aging to tiny fluctuations of the transistor temperature (in the amplifier chain) as a function of instantaneous signal amplitude.

In contrast to the digital RF predistorter embodying the invention, prior art baseband predistorters rely on complicated digital signal processing algorithms working on the demodulated low-frequency baseband digital waveform—not the rf waveform—in an attempt to compensate for the HPA's non-linear gain and phase characteristics. These prior art (indirect) methods involve either mapping an input in-phase and quadrature signal vector into an output signal vector or multiplying the signal with a level-dependent complex gain. These schemes require sophisticated, extensive digital signal processing (DSP) and are not very satisfactory.

However, the circuit complexity is not the only drawback of such prior art baseband digital predistortion schemes. The feedback delay involved in demodulating the HPA output back to baseband and then digitizing it to compare with the digital baseband data is too long (on the microsecond scale). Therefore, adaptive baseband digital predistorters can only correct slowly varying $G(s)$. Commercial adaptive baseband digital predistorters can reduce intermodulation distortion (IMD) to −55 dBc to −60 dBc on bandwidths of 10-15 MHz, falling short of even commercial wireless (GSM) requirements. Applicants' invention resides, in part, in the recognition that to reduce and suppress intermodulation distortion (IMD) below the levels noted above requires operating on the rf waveform directly and directly changing (i.e., predistoring) the rf waveform.

Applicants' near-real-time digital-RF predistortion circuitry and system predistorts the rf waveform directly. It reduces the feedback delay and corrects for instantaneous, signal-dependent fluctuations of G(s) on a sub-nanosecond time scale. The use of high over-sampling ratios allow for corrections of higher-order harmonics of the rf waveform, which is impossible in other schemes. Therefore, unlike feed-forward amplifiers, the digital-RF predistorter can correct for strong nonlinearities (which leak out a significant fraction of the power into $3^{rd}$, $5^{th}$ and higher harmonics), enabling the use of more power-efficient amplifiers (e.g., class AB). Thus, the digital-RF predistorters combine the advantages of digital predistortion—high efficiency, low cost, and high reliability—with those of analog feed-forward amplifiers—high degree of linearity and faster tracking of dynamic effects.

The transfer characteristics of various high power amplifiers (HPAs) used in systems embodying the invention may be established, including information pertaining to the distortion, in time and frequency domains, of representative radar and communications rf signals transmitted through these HPAs. This information may be stored and arranged in various look-up table (LUTs) and/or like data storage means. This information may also be selectively updated. In system embodying the invention use is made of this information to modify (predistort) the transmit signal.

Figure 4:
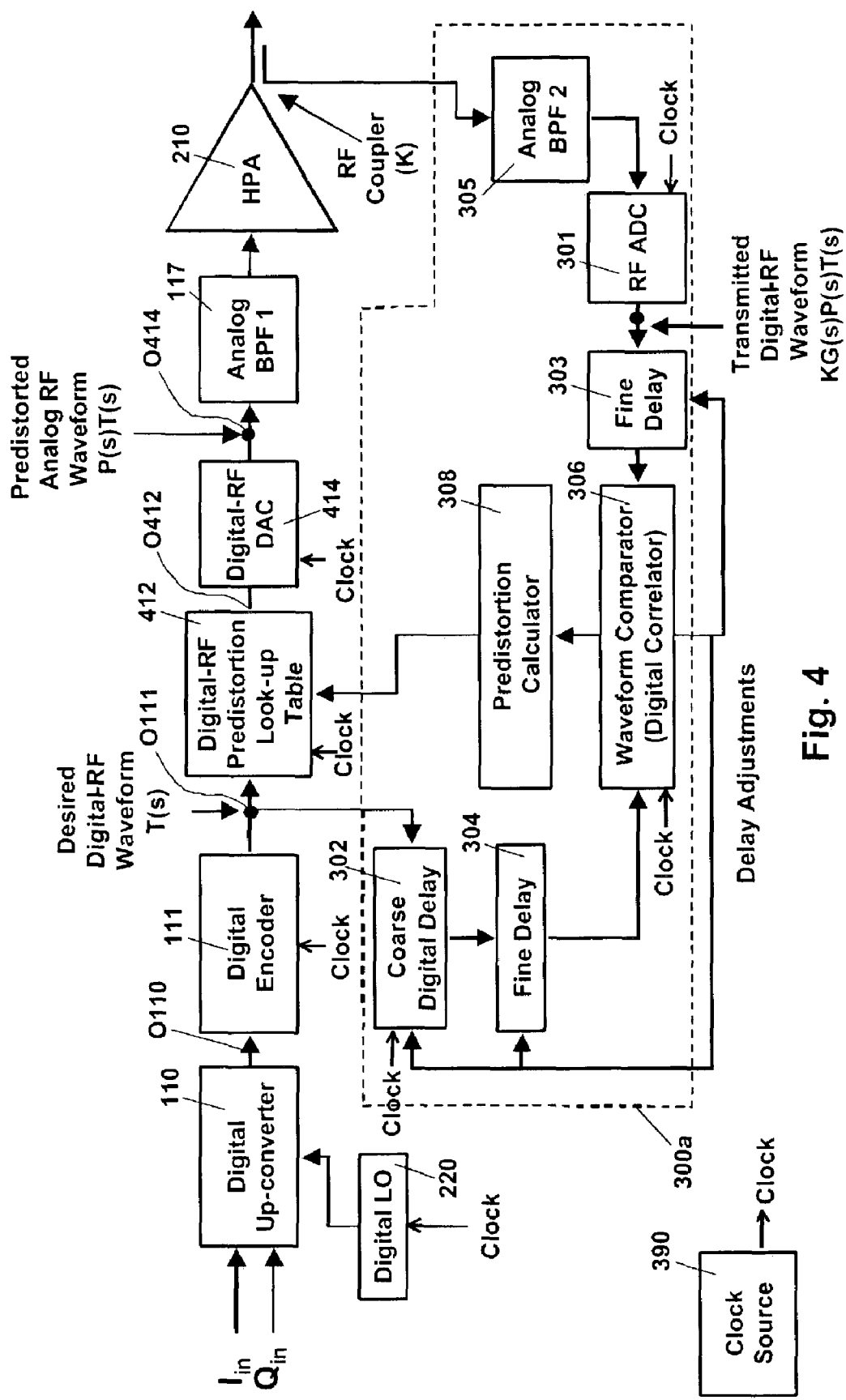
FIGS. 4 and 4A are block diagrams of adaptive digital predistorter circuits embodying the invention using a look up table.
Figure 4A:
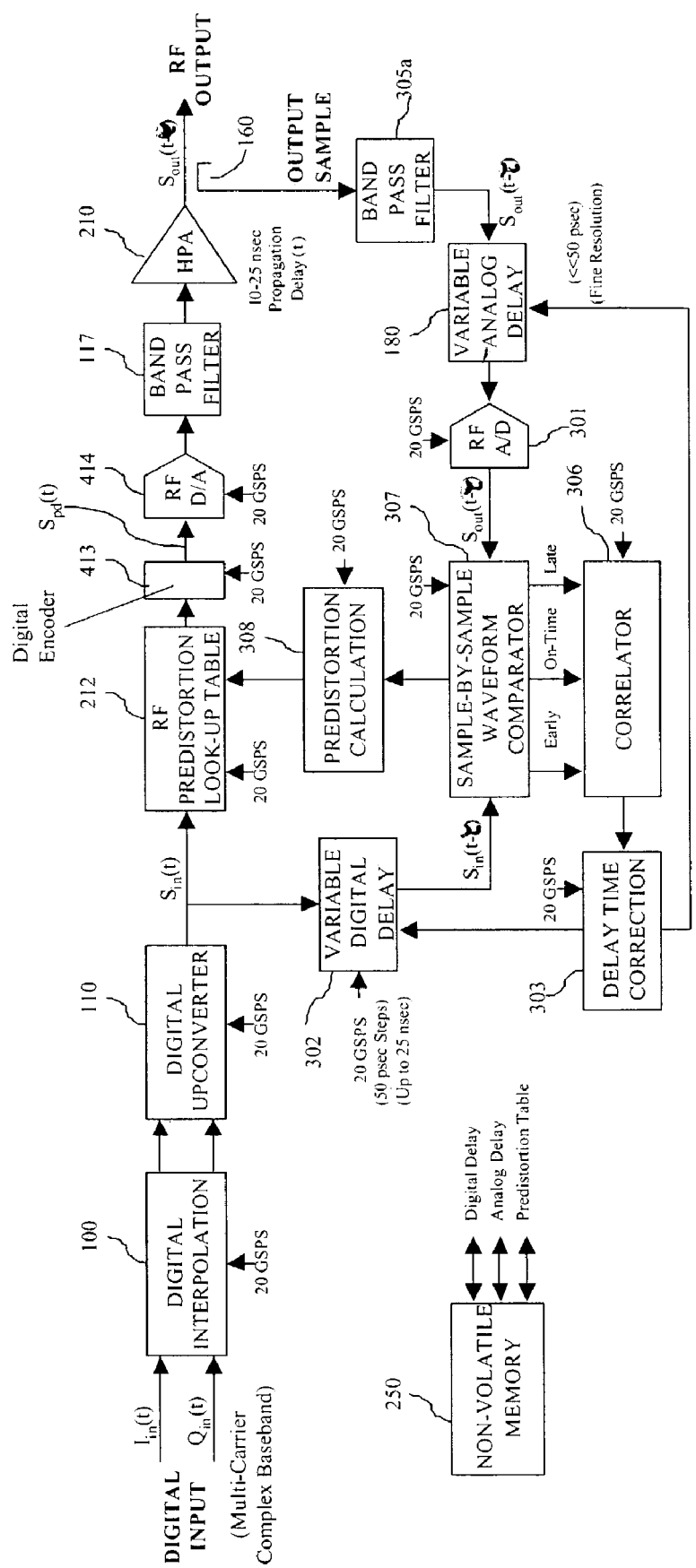

In circuits embodying the invention, the transmit loop (including digital interpolation as shown in FIG. 4A, digital up converter, digital RF pre-distorter) may be a superconducting direct digital synthesizer for rf signals, comprising a digital predistorter circuit to linearize the transfer function of the power amplifier chain, integrated with a digital-to-analog converter.

Figure 3:
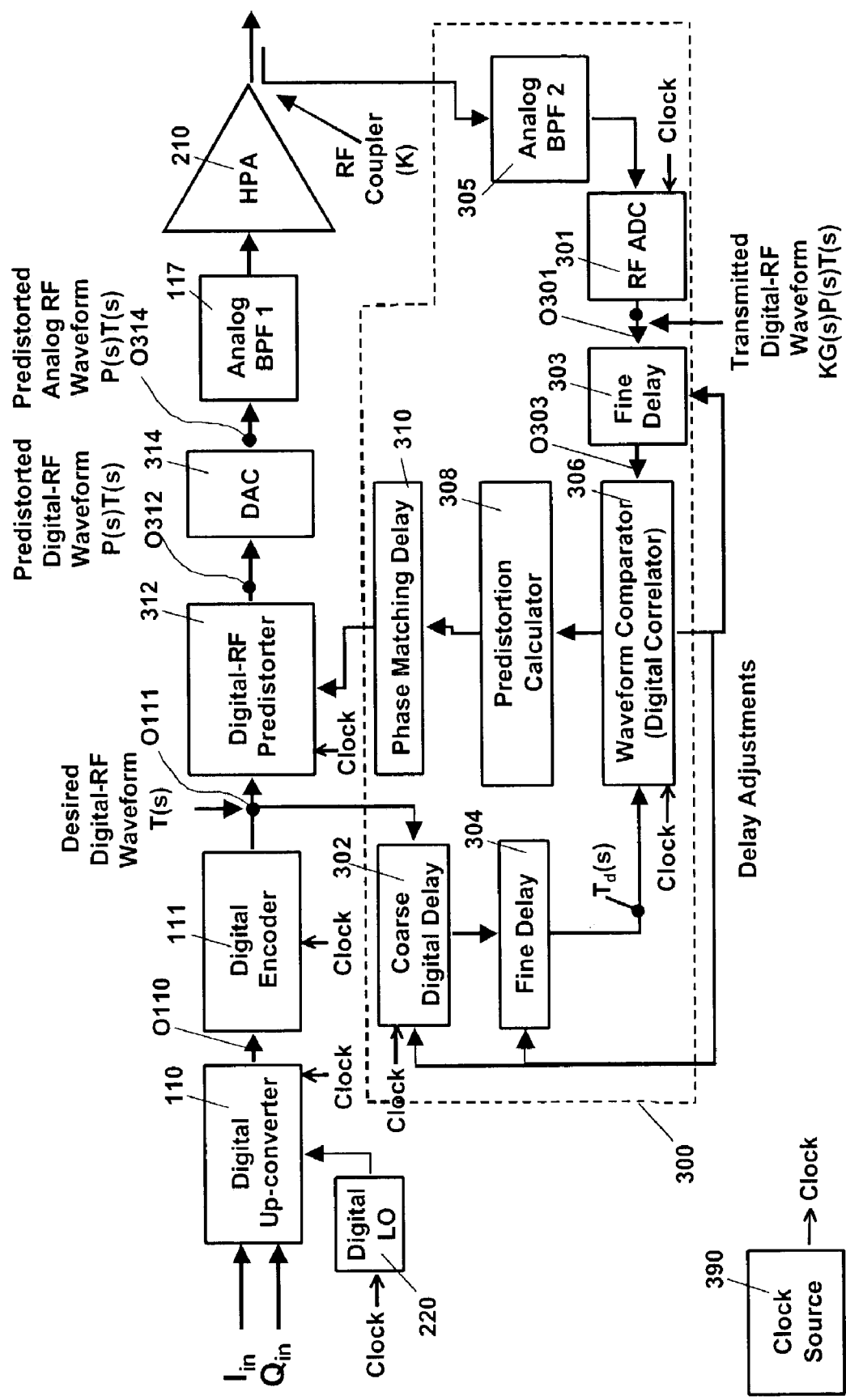
FIG. 3 is a block diagram of an adaptive (feedback)) digital predistorter circuit embodying the invention.
Figure 5:
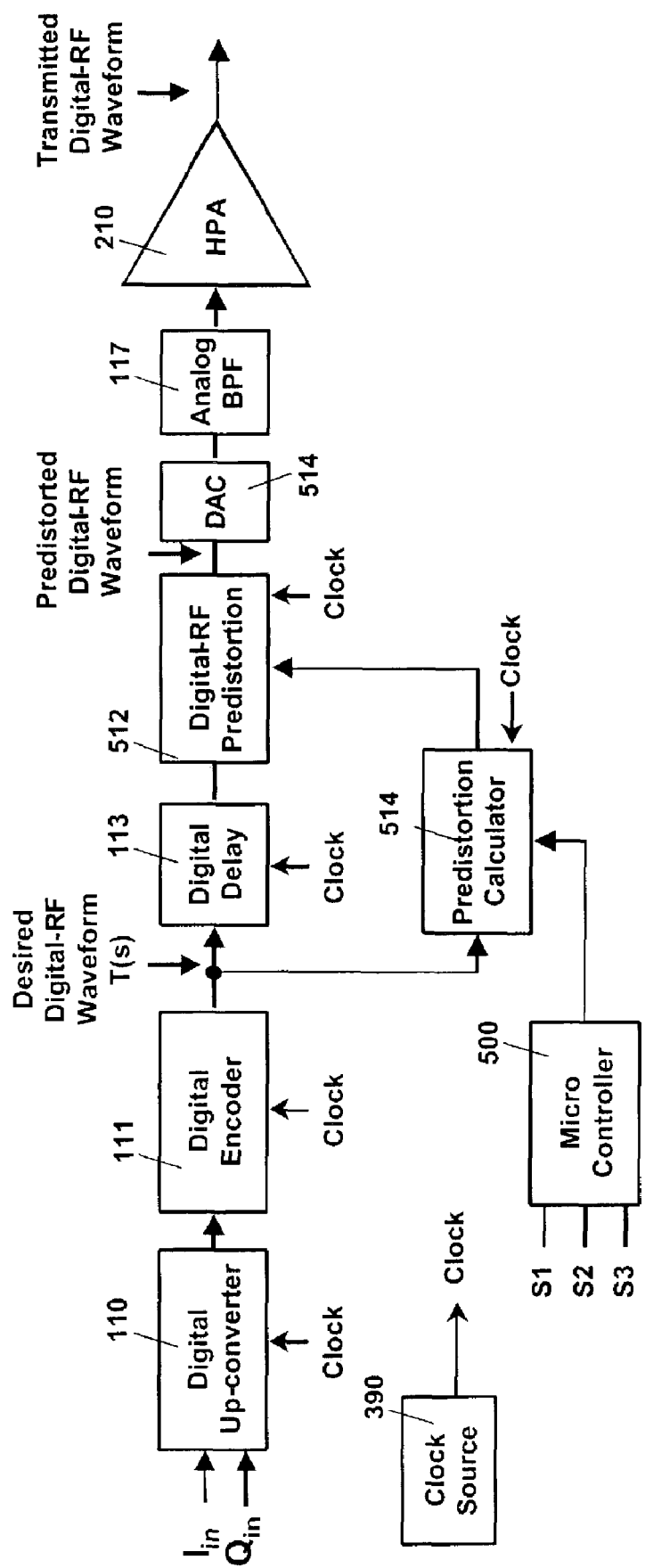
FIG. 5 is a block diagram of a predictive digital RF predistorter circuit embodying the invention.

Different architectures may be used to practice the invention. For example, in FIGS. 2 and 6, the multi-bit output of DUC 110 is applied to the input port of a digital RF predistorter. In FIGS. 3, 4 and 5 the multi-bit output of DUC 110 is applied to a digital encoder 111 for converting the multi-bit output into a corresponding serial stream of single-bit pulses and the output of the encoder is then fed to the input port of a digital RF predistorter 9 e.g., 312 in FIG. 3 and 412 in FIG. 4). The output of the predistorter is then applied to a DAC. In FIG. 4A, the multi-bit output of DUC 110 is applied to a digital RF predistorter, 212, whose output is then fed to an encoder (413) for converting the multi-bit output of the distorter into a corresponding serial stream of single-bit pulses and then to an RF DAC (414). Digital pre-distorter circuits designed for systems embodying the invention may be of the dynamic type and use ultra-fast RSFQ digital logic and other similar superconducting circuits.

Referring to FIG. 3, there is shown details of feedback circuitry used to modify an RF waveform to be applied to a high power amplifier (HPA) 210 for transmission. In FIG. 3 digital baseband signals (Iin and Qin) are applied to the input of a digital up converter (DUC) 110 whose signals are modulated by a digital local oscillator (LO) 220. The output O110 of DUC 110 which is a digital RF modulated signal is supplied to a digital encoder 111 which produces at its output O111 a desired digital RF waveform, T(s). The digital encoder, as described below, functions to convert the multi-bit output of the DUC 110 into a corresponding serial stream of single-bit pulses. The information at the output of digital encoder 111 is equivalent to the information at the output of the DUC and may also be referred to as the desired digital RF waveform, T(s). One purpose of the digital encoding is that it enables the eventual digital to analog conversion of the signals to be accomplished with a simple DAC, as further discussed below.

The T(s) signal at O111 is applied to a digital RF predistortion and DAC circuit 312 to produce at its output O312 a predistorted digital RF waveform denoted as P(s)T (s). the output of predistorter 312 is fed to the input of DAC 314 at whose output is produced a predistorted analog RF waveform also denoted as P(s)T(s). In FIG. 3 the output of the upconverter is first converted into an equivalent serial stream of single bit pulses. Then, the serial stream of single-bit pulses is modified by the predistorter and the modified signal then undergoes digital to analog conversion. The O314 signal is then fed to an analog filter 117, also identified as bandpass filter BPF1, whose output is then fed to HPA 210 at whose output is produced an RF signal ready for transmission.

FIG. 3 includes circuitry 300 for comparing the T(s) signal at output O111 with an output of HPA 210 and for generating signals for controlling the predistortion imposed on the waveform T(s). The circuit 300 includes: a coarse digital delay network 302 and a fine adjustable delay 304 for delaying the waveform T(s) and producing at the output of delay network 304 a delayed T(s) signal, denoted as $T_d(s)$. The $T_d(s)$ signal is applied to an input of a waveform comparator (digital correlator) 306. A portion of the transmitted digital RF waveform at the output of HPA 210 is applied to an analog filter 305, also identified as BPF2, whose output is fed to an RF ADC converter 301 for producing at its output O301 a signal which is proportional to the transmitted digital RF waveform and which may be denoted as KG(s)P(s)T(s). The output O301 signal is applied to a fine (adjustable) delay network 303 whose output O303 is applied to another input of digital correlator 306. The digital correlator 306 feeds delay control signals back to delay networks 302, 303, 304. The delays in 302 and 304 and the delay in 303 are designed/adjusted to ensure that the T(s) signal is delayed so that it can be compared with corresponding portions of the transmitted RF signal present at the output of HPA 210. The output of the correlator 306 is supplied to a predistortion calculator circuit 308 whose output is then supplied to a phase matching delay network 310 whose output is then fed to the digital RF predistortion and DAC circuit 312 for imposing the requisite predistortion on the T(s) signal being propagated for transmission such that the output of the HPA 210 is linearized. Thus, in the adaptive scheme of FIG. 3 predistortion signals may be directly added to or subtracted from the transmitted signal. Note that in FIG. 3, a clock signal from clock source 390 is applied to circuits 110, 111, 301, 302, 303, 306, and 312 in order to synchronize the operation of the system.

Figure 4B:
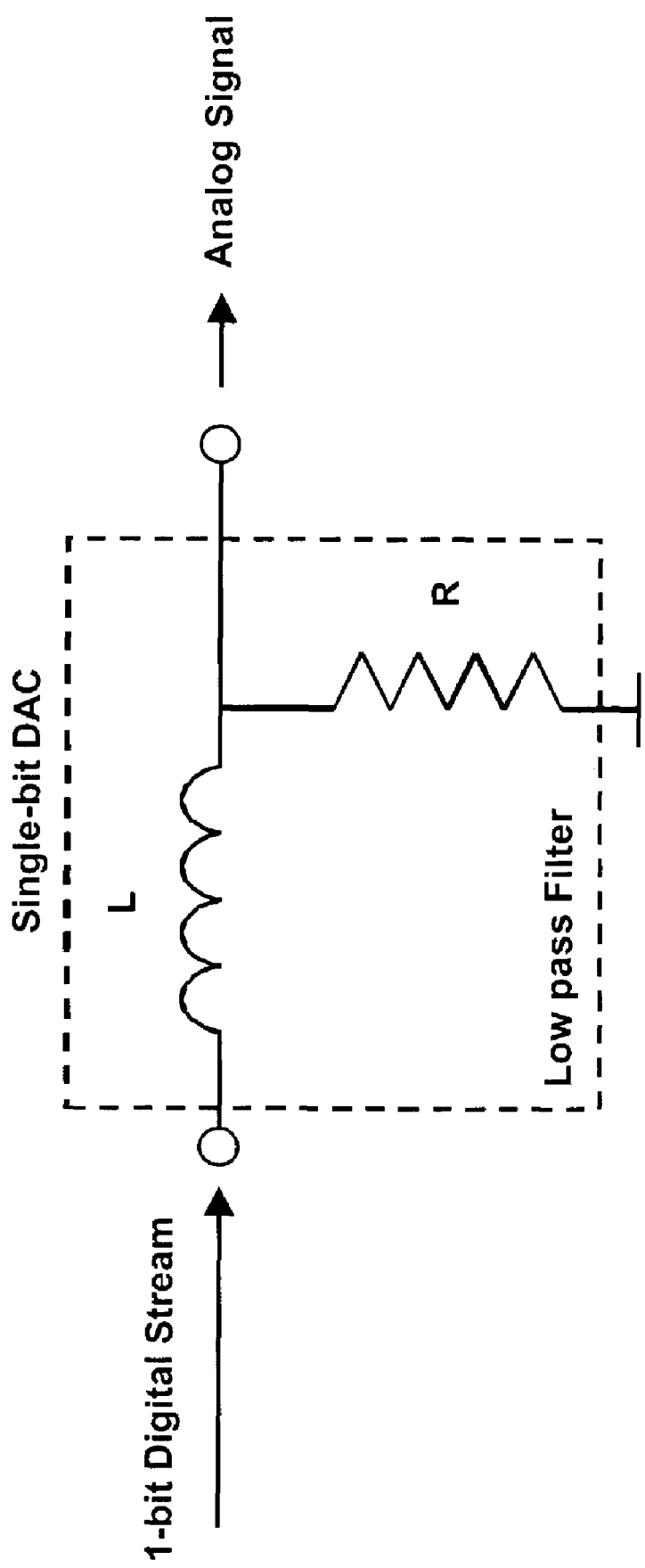
FIGS. 4B and 4C are schematic diagrams of simple digital to analog converters which may be used in circuits embodying the invention.
Figure 4C:
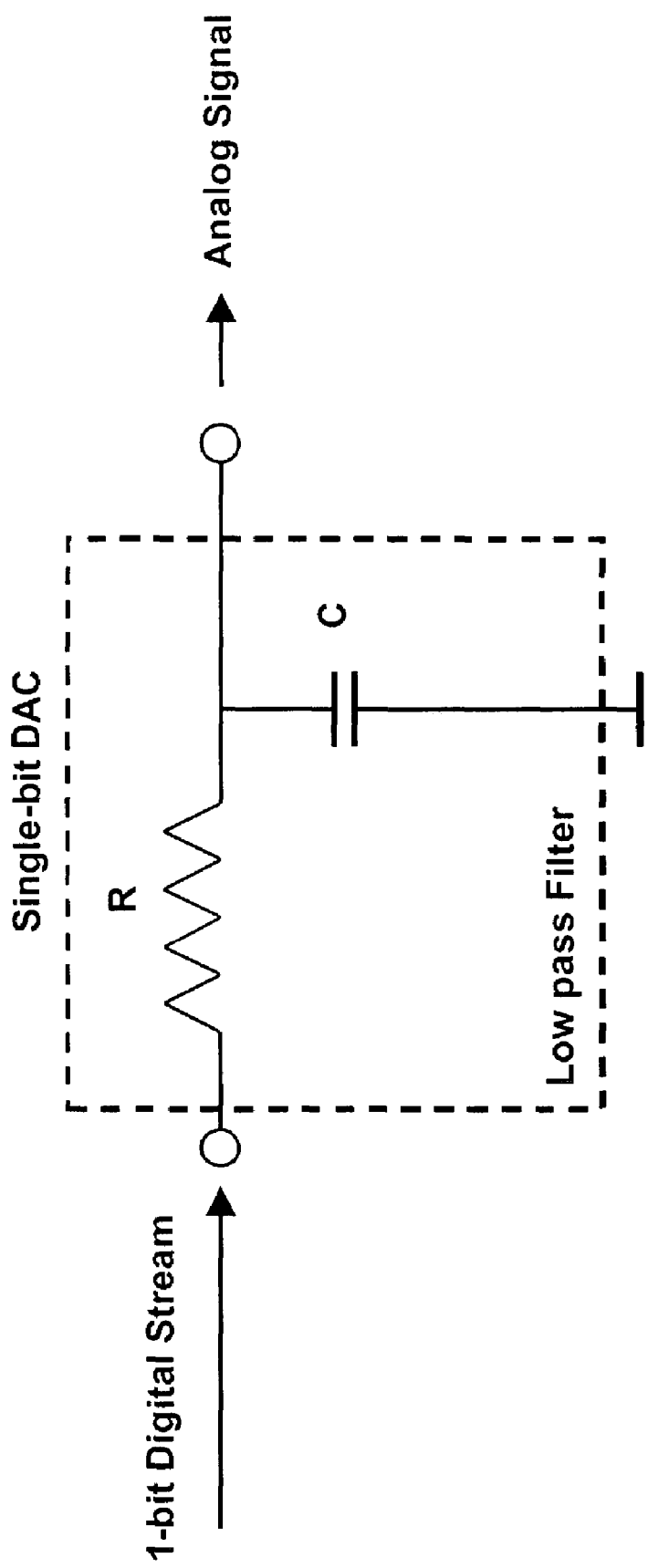

In the circuit of FIG. 4, The signal T(s) at the output of digital encoder 111 is compared to a portion of the transmitted RF waveform at the output of HPA 210 by means of circuitry 300a (which is similar to circuit 300 of FIG. 3) and the digital RF waveform T(s) is processed via a digital RF predistortion circuit 412 which includes a look up table (LUT) controlled by an output of a predistortion calculator 308. The LUT may be preprogrammed to include a substantial amount of previously obtained data pertaining to the response of the HPA 210 for a variety of different signal conditions (e.g., response to different amplitude and/or temperature conditions). In addition, the predistorter circuit 412 produces at its output 0412 a modified signal due to the operation of the LUT acting on T(s). The output 0412 is then fed to a digital RF DAC 414 to produce an analog RF output. Due to the conversion of the multi-bit signal to a single-bit serial stream of pulses it is possible to use a simple single-bit DAC. A single-bit DAC can be realized with a low pass filter using passive components (RLC circuits) as shown in FIGS. 4B and 4C, or using active circuits. FIGS. 4B and 4C show two simple first-order low pass filters. The cut-off frequency of the filter should be chosen to include the frequency of the desired analog signal and to exclude the high frequency quantization noise components. The filter can also be described as an analog integrator with an integration time (L/R or RC). More complex DACs including higher order filters may be used for better rejection of unwanted high frequency noise The analog output O414 represents a desired predistorted digital RF waveform signal P(s)T(s) supplied to an analog BPF 117 for application to HPA 210. The circuit of FIG. 4 shows an LUT used in the generation of adaptive digital RF predistortion. The LUT in presdistorter 412 may be dynamically updated via the predistortion calculator and/or other circuitry contained in the predistorter. In FIG. 4, clock signals from a clock source 390 are applied to various ones of the circuits (e.g., 110, 111, 301, 302, 303, 304, 412 and 413) for synchronizing their operation and ensuring proper timing.

In FIG. 4A, a multi-carrier complex digital baseband input signal (Iin(t), Qin(t)) is applied to a digital interpolation circuit 100 which is sampled at a rate of 20 giga samples per second (20 GSPS). The output of the interpolator 100 is applied to the input of digital up-converter 110 which is also sampled at the rate of 20 GSPS. The output of up-converter 110 is a multi-bit signal identified as Sin(t) which corresponds to the T(s) signal of FIGS. 3 and 4. The Sin(t) signal is supplied along a transmit path to a digital RF predistorter 212 and along a comparison path to circuitry of the type shown in FIGS. 3 and 4. The transmit path includes the application of the Sin(t) signal to RF pre-distortion circuit 212, which is also sampled at a 20 GSPS rate, and which includes a look-up table (LUT). In FIG. 4A, the signal at the output of digital RF predistorter 212 is a multi-bit signal and is a modified version of Sin(t). The output of predistorter 212 is applied to the input of an encoder 413, also sampled at 20 GSPS, which functions to convert the multi-bit signal into a corresponding serial stream of single-bit pulses identified as Spd(t). The Spd(t) signal is applied to an RF DAC 414. The multi-bit to single bit conversion enables the use of a very simple single-bit DAC of the type shown in FIGS. 4B and 4C. However, in practice, higher order filters may be used, The output of RF D/A 414 is applied to a BPF 117 whose output is applied to the input port of HPA 210. The output (Sout(t-T)) of HPA 210 is sampled via sampler 160 and fed back via a bandpass filter (BPF 305a) to the input of a variable analog delay network 180. The output of delay network 180 is applied to the input of an RF ADC 301 whose output which is proportional to Sout(t-T) is applied to an input of a sample-by-sample comparator 307. Another input to comparator 307 is the signal Sin(t-T). Sin(t-T) is produced by application of Sin(t) to a variable digital delay line 302 at whose output is produced Sin(t-T). By way of example, delay network 302 can produce delays in increments of 50 pico-seconds per step and a total delay of 25 nanoseconds. Sin(t-T) is compared to Sout(t-T) in comparator 307 to produce signals (e.g., early, on time, late) applied to a correlator 306 which functions to supply signals to delay time correction circuit 303. Control circuit 303, in turn, functions to control variable digital delay network 302 and variable analog delay 180 to adjust the phase and/or delay between Sin(t-T) and Sout(t-T) as part of the predistortion processing. Another output of comparator 307 is applied to a predistortion calculator 308 which controls the LUT in RF pre-distortion 212, which functions as discussed above. FIG. 4A includes a non-volatile memory 250 which may contain stored data or whose data can be updated to provide information pertaining to digital and analog delays and pre-distortion table. Thus, the circuit of FIG. 4A is an adaptive system which functions to generate a predistorted signal for the HPA to linearize its response.

FIG. 5 shows a predictive system for modifying (linearizing) a desired digital RF waveform (T(s)) to be transmitted by an HPA. As in FIGS. 3 and 4 the digital baseband input signals are up-converted via a DUC 110 to produce a multi-bit signal sampled at a very high rate. The multi-bit output of DUC 110 is then applied to digital encoder 111 to produce a corresponding serial stream of single-bit pulses identified as the desired digital RF waveform T(s). The T(s) waveform is then modified (pre-distorted) to compensate or correct for known non-linear responses and irregularities of the HPA to certain signal conditions. In FIG. 5, the T(s) signal is first applied to a digital delay network 113 whose output is applied to an input port of a digital RF pre-distortion network 512. Predistorter 512 has a control port to which control signals are applied from a predistorter calculator 514 to cause predistorter 512 to produce at its output port an output signal identified as the predistorted digital RF waveform, P(s)T(s). The modifications imparted to digital RF waveform, T(s), by network 512 are determined by predistortion calculator 514 whose output is applied to a control port of pre-distorter 512. In FIG. 5, the predistortion calculator 514 is shown to be responsive to the desired digital RF waveform, T(s), signal and to signals from a micro-controller 500. The micro-controller 500 may in turn be responsive to various sensors and signals (s1, s2, s3). In response to these signals which may be, for example, the temperature of the HPA or a signal indicative of the amplitude of the HPA output, or some other pre-selected signal, the micro-processor 500 supplies signals to the pre-distortion calculator 514. The combination of the pre-distortion calculator 514 and the micro-processor 500 function similarly to the look-up table (LUT) discussed above and may also function to dynamically update the information in the LUT. In response to values of the digital RF waveform and to signals from the controller 500, the pre-distortion calculator 514 supplies signals to pre-distorter circuit 512 to produce a predistorted RF waveform P(s)T(s). The signals at the output of the predistorter undergo digital to analog conversion by means of a DAC which as noted above may have a very simple structure where the signal being processed is a serial stream of single-bit pulses. The pre-distorted analog output is then applied via BPF 117 to the input port of HPA 210 whose signal output will have a greater degree of linearity due to the pre-distortion introduced into the RF waveform T(s) by means of pre-distortion calculator 514, micro-controller 500 and pre-distorter 512.

Figure 6:
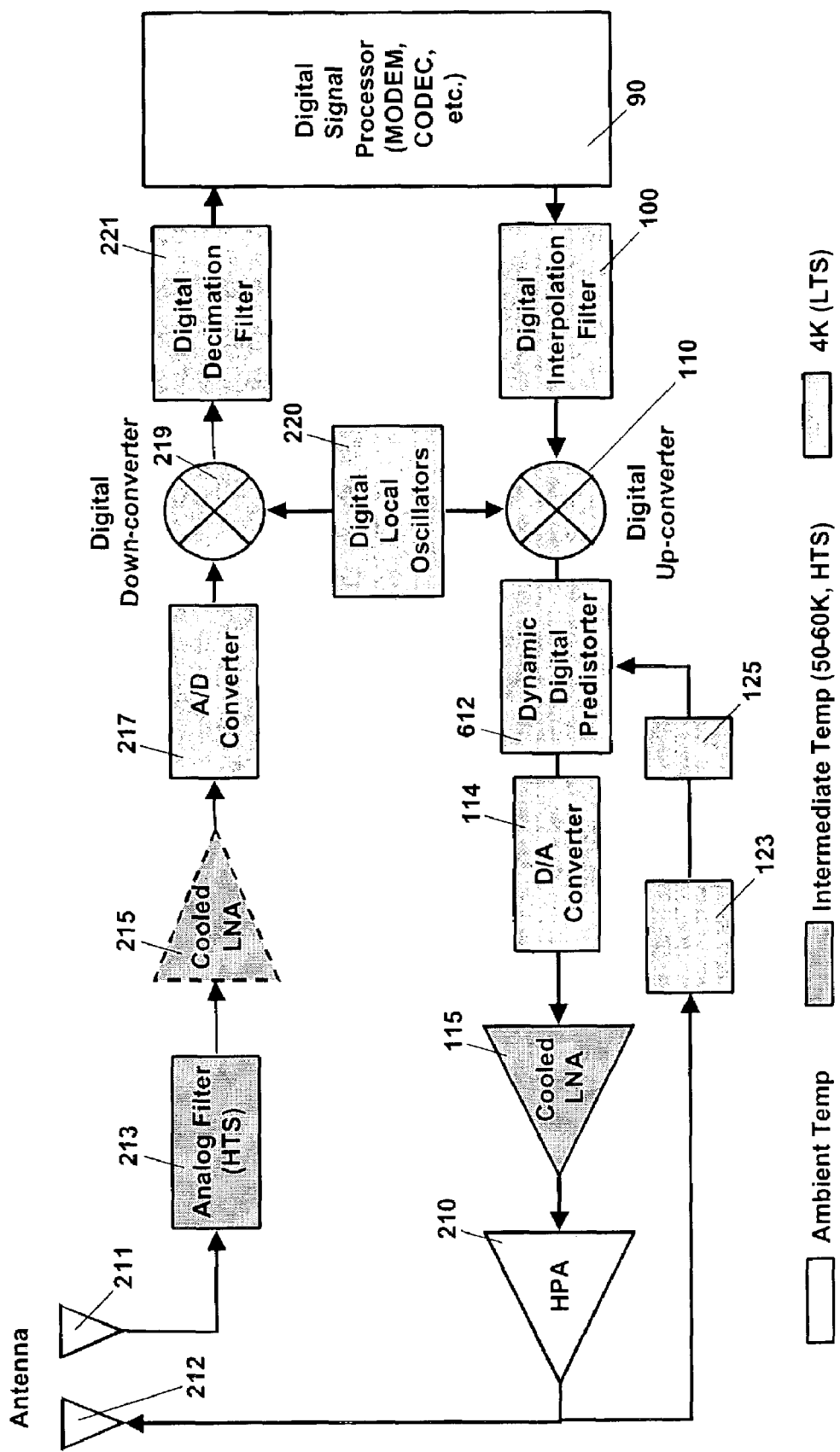
FIG. 6 is a block diagram of a superconducting digital RF transceiver embodying the invention.

FIG. 6 is a simplified block diagram of a superconducting digital-RF transceiver illustrating the concept of extending digital processing to rf in accordance with the invention. The receiver section includes a receiving antenna, 211, whose output is coupled to an analog filter 213 whose output is supplied to cooled low-noise amplifier (LNA) 215 whose output is supplied to an A/D converter 217 whose output is supplied to a digital down converter (DDC) 219 whose output is then fed to a digital decimation filter 221 whose output is then supplied to a digital signal processor (DSP) 90 for processing the received signals. In the system of FIG. 6, the digital down converter 219 and a digital up converter 110 are modulated by means of digital local oscillators (LO) 220.

The transmitting section includes a digital interpolation filter 100 to which signals to be transmitted are supplied from DSP 90. The output of the digital interpolation filter 100 is supplied to a digital up converter (DUC) 110 whose output is then supplied to a dynamic digital predistorter 612 (which may be like predistorter 112a of FIG. 2 or 312 of FIG. 3, or 412 of FIG. 4 or 512 of FIG. 5 or any other suitable predistorter) whose output is supplied to a DAC 114 whose output is supplied to cooled low-noise amplifier (LNA) 115 whose output is then supplied to a high power amplifier 210 whose output is then supplied to a transmitting antenna 212. The DAC 114 may include encoding circuitry for converting a multi-bit signal to a serial stream of pulses and digital to analog conversion. The output of HPA 210, as discussed herein, may be sensed via feed back elements 123 and 125 and fed back to the dynamic digital predistorter 612. The operation of the feedback loop is similar to that shown and discussed for FIGS. 3 and 4.

Systems embosdying the invention include superconducting direct digital synthesizers for rf signals, comprising digital predistorter circuitry to linearize the transfer function of the power amplifier chain, integrated with a digital-to-analog converter (DAC). The invention includes a digital encoder which may be used as part of a novel digital-to-analog converter. The predistorter is designed to compensate for distortions, in time and frequency domains, of radar and communications rf signals transmitted through the transmitting amplifiers.

Applicants' proposed digital-RF predistorter is not an isolated circuit. The predistortion function is combined with direct synthesis of the analog RF waveform from its digital representation. The most natural implementation of the predistortion DAC using superconducting RSFQ circuits is the generation and manipulation of a single-bit (i.e., 1-bit) oversampled stream of SFQ pulses. Intuitively, this single-bit DAC is simply a low-pass filtered SFQ pulse stream.

As discussed above, in systems embodying the invention a multi-bit number (or word) may be converted into a serial stream of single-bit pulses which may be supplied to a simple DAC for producing a corresponding analog voltage; i.e., doing a digital-to-analog conversion (DAC). There are various methods of generating a 1-bit serial pulse stream from multi-bit binary data. A desirable encoding scheme, which may be called a staggered or interleaved thermometer code, lends itself to convenient circuit implementation with existing RSFQ cells; although any other suitable circuitry may be used. Moreover, the staggered or interleaved thermometer code has high-frequency quantization noise-shaping properties similar to the widely used delta-sigma code.

For ease of the description to follow reference is made to Table 1 below.

In accordance with the invention, each bit of an N-bit word is assigned an equivalent weight corresponding to its order. Thus, assume that an N-bit word (e.g., a 4-bit word) having a sampling frequency of f(s) is applied to an encoder and a DAC. During each cycle (or period) of the sampling frequency, f(s), for each bit of the N-bit word there is produced a frequency signal (e.g., a number of pulses) representing the equivalent weight of the bit. The number of pulses or the quality of the frequency signal assigned to each bit may be illustrated by reference to the two right hand columns of TABLE 1.

TABLE 1

| | | | | | |
|---|---|---|---|---|---|
| MSB | $N^{TH}$ BIT | BIT(N−1) | $2^{N-1}$ | $2^{N-1}$ pulses/cycle or $[2^{N-1}]f_s$ | $f/2$ |
| | $j^{TH}$ BIT | BIT(j−1) | $2^{j-1}$ | $2^{j-1}$ pulses/cycle or $[2^{j-1}]f_s$ | $f/2^{(N+1-j)}$ |
| | $4^{TH}$ BIT | BIT-3 | $2^3$ | 8 pulses/cycle or $8f_s$ | $f/2^{(N-3)}$ |
| | $3^{RD}$ BIT | BIT-2 | $2^2$ | 4 pulses/cycle or $4f_s$ | $f/2^{(N-2)}$ |
| | $2^{ND}$ BIT | BIT-1 | $2^1$ | 2 pulses/cycle or $2f_s$ | $f/2^{(N-1)}$ |
| LSB | $1^{ST}$ BIT | BIT-0 | $2^0$ | 1 pulse/cycle or $f_s$ | $f/2^N$ |

Corresponding to each ordered bit of the N-bit word there is generated a corresponding frequency signal or number of pulses; i.e., there are N different sets of frequency signals (or sets of pulses) for the N-bits; one set per bit; each set having a value representative of its corresponding bit. In accordance with the invention, the N different sets of frequency signals are interleaved into a serial stream representative of the value of the N-bit number such that pulses corresponding to the lower order bits appear between pulses corresponding to higher order bits as further discussed below.

Figure 7:
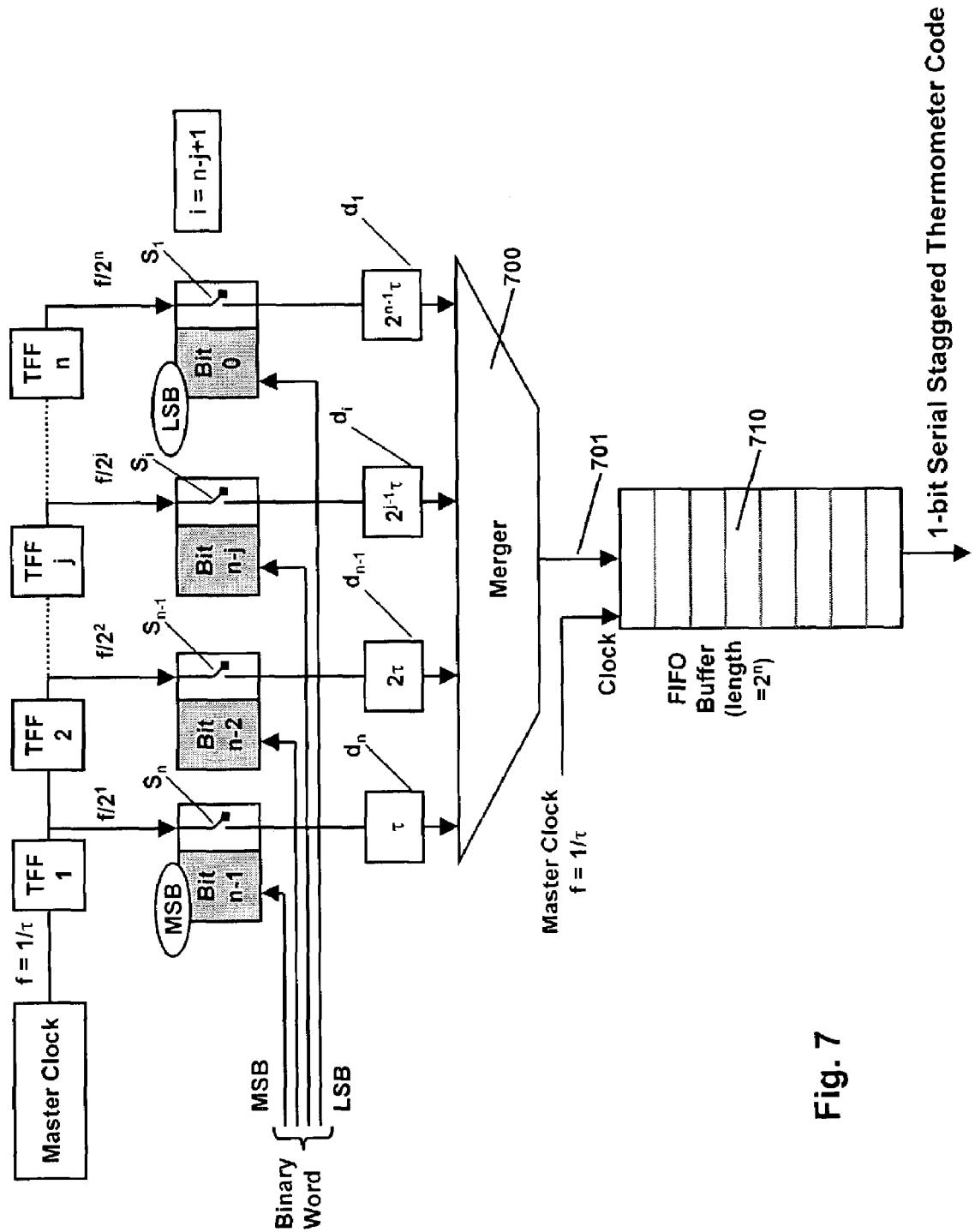
FIG. 7 is a block diagram of a digital encoding scheme for converting an n-bit number to a one bit serial code.

FIG. 7 is a block diagram of an encoder circuit embodying the invention for converting an n-bit binary number (or word) into a 1-bit serial sequencing code. The n-bits (B(0)-B(n−1)) of the word, which have a predetermined order, are applied to a set of n switches (S1-Sn); there is one bit per switch, each bit controlling the conductivity of its corresponding switch. Each switch (Sj) may be described as having an input port to which is applied a frequency signal (or a set of pulses), a control port to which is applied one bit of the n-bit word, and an output port. Each switch (S1-Sn) controls the flow of the frequency signals (i.e., (f/2 through f/2″) applied to its input port as a function of the value of the binary bit applied to the control port of the switch. If the value of the binary bit applied to the control port of a switch is a logic "1" its corresponding clock stream (e.g., comprised of SFQ pulses) propagates through the switch and is reproduced at the output port of the switch; but, if the value of the bit is a logic "0", the clock stream does not flow through the switch (e.g., the pulses are rejected). Thus, when the value of the bit applied to the control port of a switch has a value of logic "1" it is assumed that the frequency signal for pulses present at the input port of the switch passes to, or is reproduced at, the output port of the switch. When the value of the bit applied to the control port of a switch has a value of logic "0" it is assumed that no signal is passed to, or is produced at, the output port of the switch. Thus, each switch allows (or blocks) the passage of a frequency signal (or a set of pulses) applied to an input port of the switch.

Corresponding to each bit of the n-bit word a unique frequency signal or set of pulses is generated. In FIG. 7 there is a master clock circuit 71 for generating a clock signal of frequency "f" from which is generated a set of n binary sub-harmonics of the master clock (f); i.e., a different sub-harmonic is generated corresponding to each bit of the n-bit binary word. In FIG. 7 this is done by applying the master clock of frequency f to a series of "n" toggle flip flops (TFF); each of which functions as a divide-by-two circuit. Thus, at the output of each jth one of the n TFFs there is produced a corresponding lower frequency signal equal to $f/2^j$, as j increases from 1 to n.

Figure 14B:
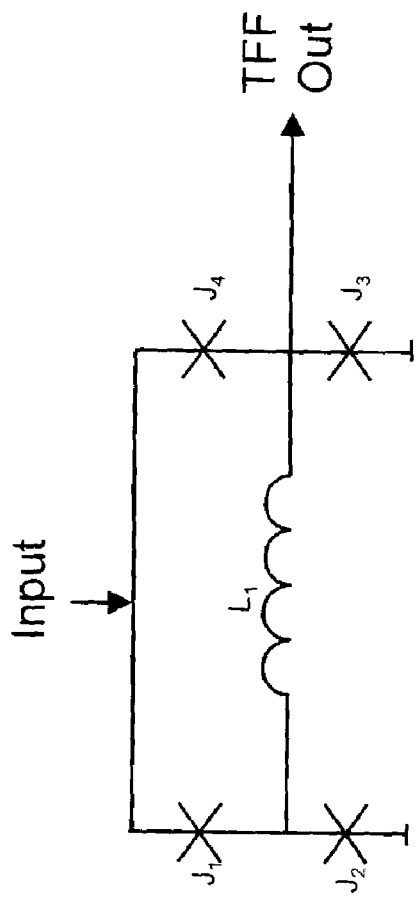
FIGS. 14(*a*) and 14(*b*) are, respectively, the symbolic representation of a toggle flip-flop (TFF) cell useable as a binary divider and its circuit schematic representation.
Figure 14A:
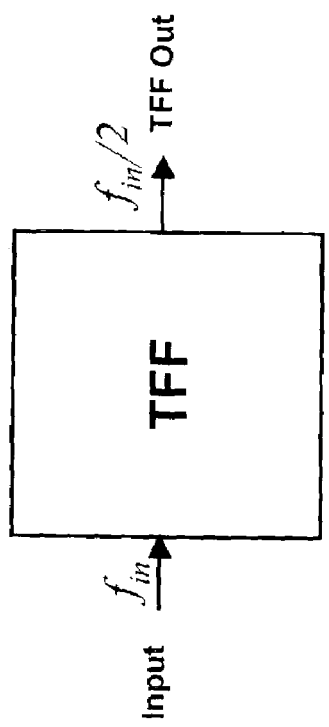

The toggle flip-flops (TFFs) may be represented as shown in block form in FIG. 14a with an input to which input signals (fin) are applied and an output at which output signals (fin/2) are produced; where the output signals have one half the frequency of the input signals. FIG. 14b is a schematic diagram of a super-conducting TFF circuit suitable for use in practicing the invention. The circuit includes Josephson junctions (J1-J4) and an inductive coil L1. A pulse arriving at the input alters the state of the flip-flop (from '0' to '1' or from '1' to '0'). A sequence of pulses alternately sets and resets the flip-flop, producing a pulse at the output for every other input pulse.

Referring to FIG. 7, each one of the outputs of the various toggle flip-flops (i.e., TFF(1)-TFF(n)) is applied to the input port of a respective one of the n switches to which are applied the various bits of the n-bit binary word. There are n switches, (S1-Sn), where each switch is controlled (set) by a corresponding one of the binary bits. The first bit of the n-bit number which is defined as the least significant bit (LSB), also identified as Bit "0", is applied to the control port of the switch identified as S1 and the nth bit of the n-bit number which is defined as the most significant bit (MSB), also identified as Bit (n−1), is applied to the control port of switch Sn. Each intermediate bit is applied to a corresponding intermediate switch. Thus, each bit of the "n" bit number (or n-bit word) is applied to the control port of a different one of the n switches, in an ordered manner, for controlling the passage of the corresponding frequency signals applied to the input port of the switch. Each bit of the n-bit word is applied to the control port of a switch (i.e., S1-Sn) to control the passage of a corresponding frequency signal applied to the input port of its switch. The frequency signal and/or the set of pulses applied to the input port of a switch corresponds to (and/or depends on) the order of the bit applied to the control port of the switch. That is, the switch (Sn) to which the most significant bit (MSB), of the binary number to be converted, is applied has the highest clock frequency signal (f/2) applied to its input port and the switch (S1) to which the least significant bit (LSB), of the binary number to be converted, is applied has the lowest clock frequency signal (f/2$^n$) applied to its input port. Thus the MSB corresponds to, and controls, the passage of the highest clock frequency signal (f/2), while the LSB corresponds to and controls the passage of the lowest frequency signal (f/2$^n$). The passage of the set of pulses having the largest number of pulses and/or the highest frequency signal is controlled by the switch to which the MSB is applied and in an ordered sequence, the passage of the set of pulses having the lowest number of pulses and/or the lowest frequency signal is controlled by the switch to which the LSB is applied.

In FIG. 7 the least significant bit (LSB) is arbitrarily defined as Bit "0" and the most significant bit (MSB) is defined as Bit (n−1). For the nomenclature and reference characters assigned to the switches and to the frequency signals in FIG. 7, a frequency signal (e.g., f/2$^j$=f/2$^{(n+1)-1}$ or an equivalent set of pulses) is applied to the input port of each switch denoted as $S_i$, as i varies from 1 for LSB to n for MSB.

As already noted, the frequency signals may correspond to sets of pulses. Thus corresponding to MSB, the f/2 frequency signal may correspond to the generation of "n" pulses during a sampling cycle and corresponding to LSB the f/2$^n$ frequency signal may correspond to the generation of one (1) pulse during a sampling cycle.

Referring to FIG. 7, note that the frequency signals (or pulses) present at the output port of each switch ($S_1$-$S_n$) are applied to a corresponding delay element (e.g., $d_1$-$d_n$). The set of digital delay elements ($d_1$-$d_n$) are employed to prevent bunching of the pulses, as well as to assign appropriate locations within the frame. The output signals from the delay networks, which will appear as clock streams, are applied to a merging network 700 for merging these clock streams to provide a single-bit serial code on an output line 701. The delay elements ($d_1$-$d_n$) produce digital delays which are multiples of the master clock period (τ=1/f). The location assignment, corresponding to the staggered thermometer code, is defined by choosing these delays to be binary multiples of the master clock period τ. The delay $d_i$ connected at the output of switch $S_i$ has the value $2^{(n-i)}$τ. For example, the delay $d_n$, corresponding to the MSB, is $2^0$τ, while the delay $d_1$, corresponding to the LSB, is $2^{n-1}$τ. The pulse streams are merged via merger circuit 700 having a tree of confluence buffer cells (which may be of the type shown in block form in FIG. 15(a) and schematically in FIG. 15(b) to ensure equal delay paths for each branch. After merger, the sequence of pulses occurring within each time frame of length $2^n$τ is equivalent to the n-bit word applied to the control port of the switches ($S_1$-$S_n$). While this encoding scheme is synchronous, so that the pulses occupy individual time slots (τ) within the frame, additional synchronization is possible (but not necessary) by storing these frames in a shift register buffer. For clarity, we will refer to these time slots as locations within the buffer.

Figure 12B:
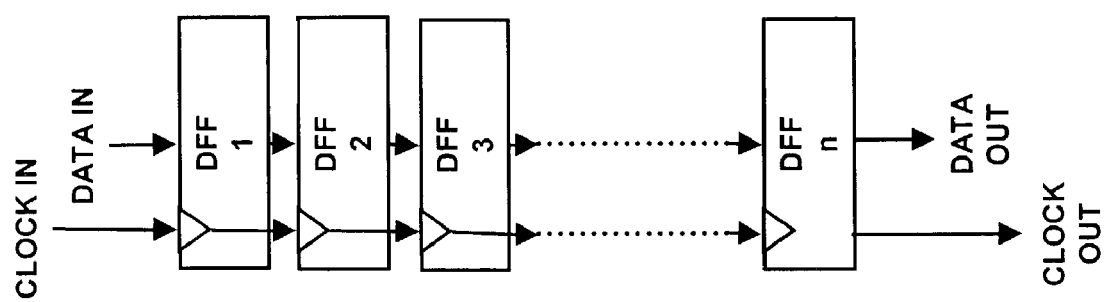
FIGS. 12(*a*) and 12(*b*) are respectively, a block diagram representation of a shift register and the interconnection of DFF cells to form a shift register suitable for use in practicing the invention.
Figure 12A:
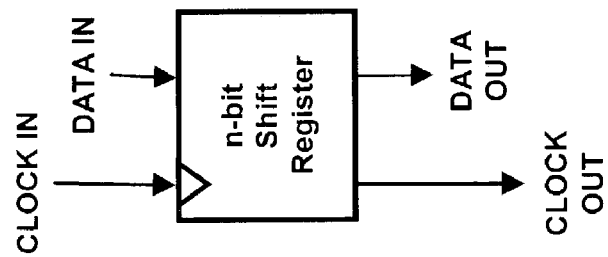

In FIG. 7, the merged serial bit stream from the delay networks is clocked through a first-in-first-out (FIFO) shift register 710. The n-bit number is represented as Bit 0 to Bit(n−1); where Bit 0 is the LSB and Bit (n−1) is the MSB. Each bit is assigned a set of locations in the shift register 710 having a frame of length of $2^n$. The most significant bit (MSB) is assigned $2^{n-1}$ locations, and each successive less significant bit is assigned half as many locations, with the LSB being assigned one location. The n-bits of an n-bit number are assigned and can fill up to $2^n-1$ locations, leaving one blank. In the staggered thermometer algorithm, in accordance with the invention and as illustrated in FIG. 8D, corresponding to the nth bit, MSB (Bit n−1), there is generated $2^{(n-1)}$ pulses which occupy every other location, starting from the second location. The next less significant bit (Bit n−2) occupies every fourth location, starting from the third location. In general, where j varies from 1 for the MSB condition to n for the LSB condition, then corresponding to Bit (n−j) there is produced $2^{(n-j)}$ pulses, [and/or a frequency signal equal to f/2$^j$], with one of these pulses occupying every $2^j$ th location, starting with the $(1+2^{j-1})$th location. Finally, the LSB (Bit 0) occupies the $(1+2^{n-1})$th location. The shift register may be formed as shown in FIG. 12, or it may have any other suitable form.

Figure 8A:
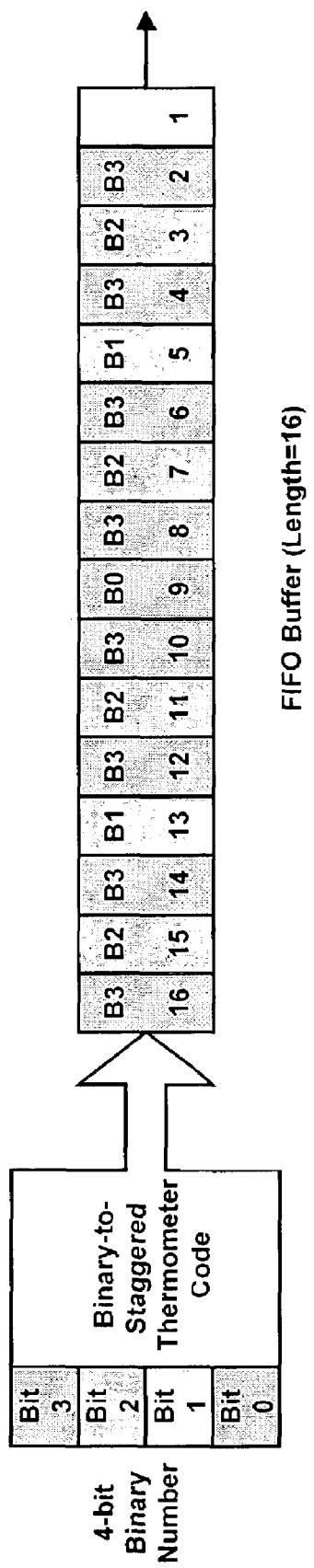
FIG. 8A shows the location assignment of a 4-bit binary number to a serial first-in first-out (FIFO) buffer in accordance with the invention.

FIG. 8A shows the location assignment of a 4-bit binary number to the serial FIFO shift register 710 having a length of 16 locations to accommodate the 4-bit number. The MSB or (B3) corresponds to Bit (n−j) where n=4 and j=1 for which there is generated $2^{(n-j)}$ pulses (i.e., 8 pulses, for n=4 and j=1) and these pulses occupy every other location starting with the second location, for a total of 8 locations. The next lower bit (B2) corresponds to Bit (n−j) where n=4 and j=2 for which there is generated $2^2$ pulses (i.e., 4 pulses, for n=4 and j=2) and these pulses occupy every fourth location starting from the third location. The 2 pulses generated for the next lower bit (B1) occupy every eighth location starting from the fourth location. The one pulse corresponding to LSB (B0) occupies the ninth location.

Figure 8B:
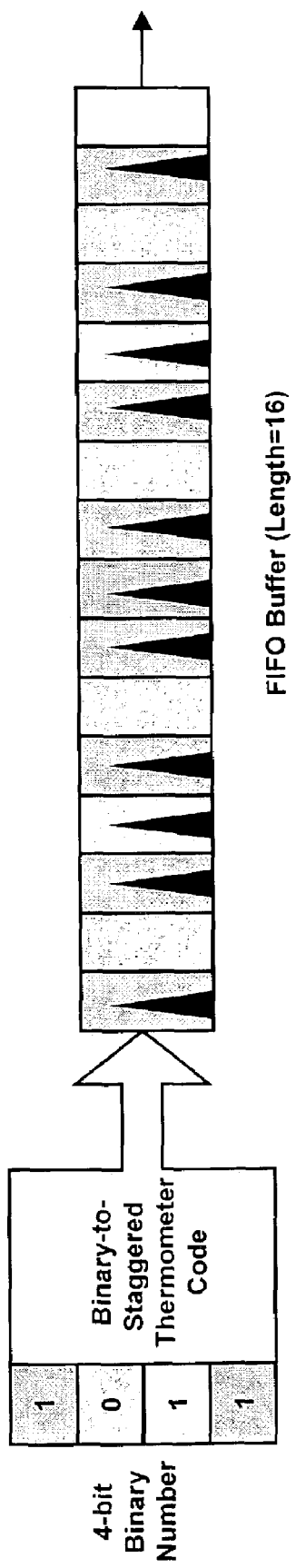
FIGS. 8B and 8C illustrate the distribution pattern of 11 SFQ pulses filling a buffer with a frame length of 16 locations and the generation of "output" pulses corresponding to each bit, in accordance with the invention.
Figure 8C:
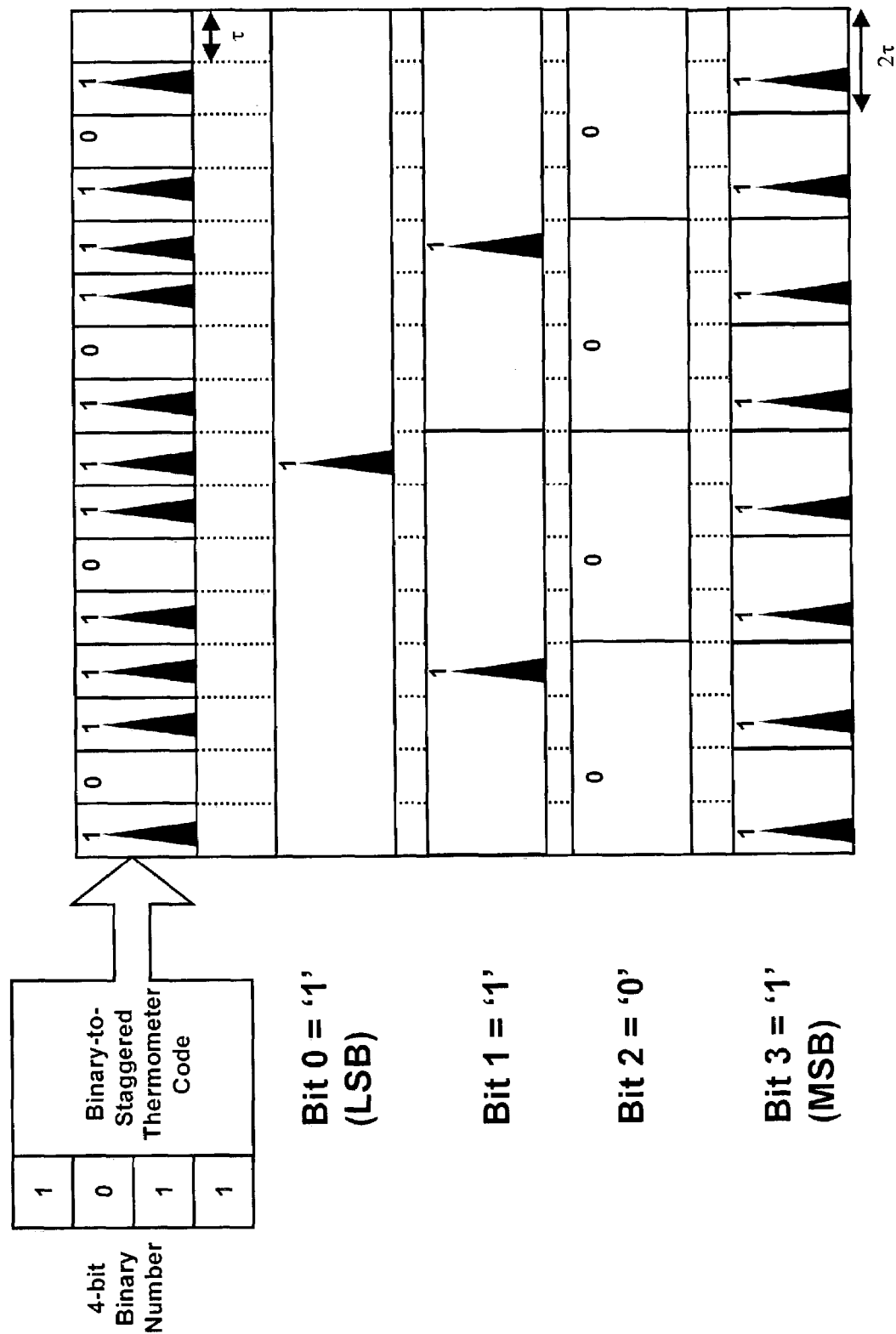
Figure 8D:
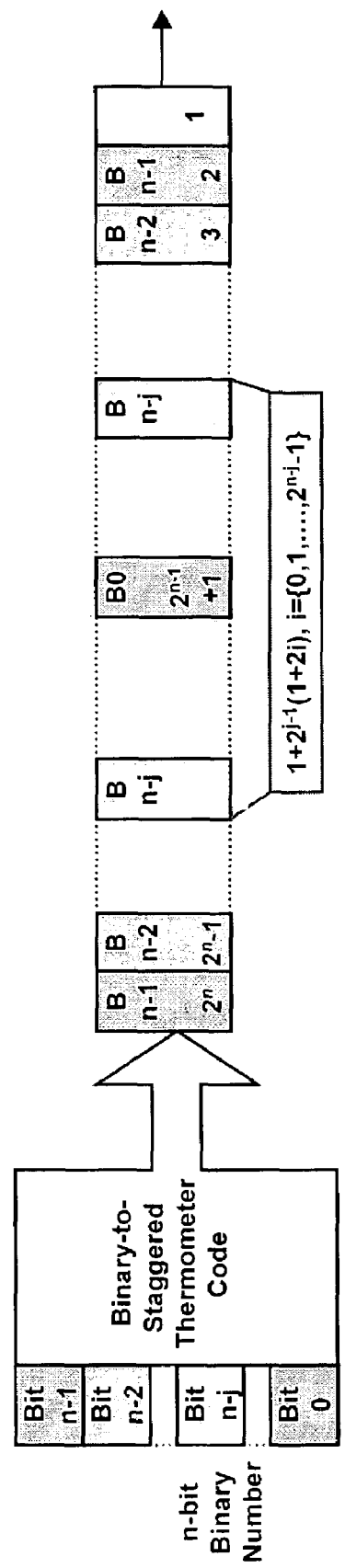
FIG. 8D shows the location assignment algorithm for an n-bit binary number, corresponding to the circuit scheme of FIG. 7.

FIG. 8B shows which locations of the register 710 would be filled for a 4-bit number whose bits have the values of 1011. The resulting pattern, as shown in FIG. 8B, would be a pattern of 11 pulses in the shift register 710 of length of 16. FIG. 8C shows how the frequency signals (i.e., the various pulses) generated at the outputs of the switches for the 4-bit binary word having a value of 1011 appear in their respective time slots and are then combined in their respective locations in a shift register or like register.

Figure 9:
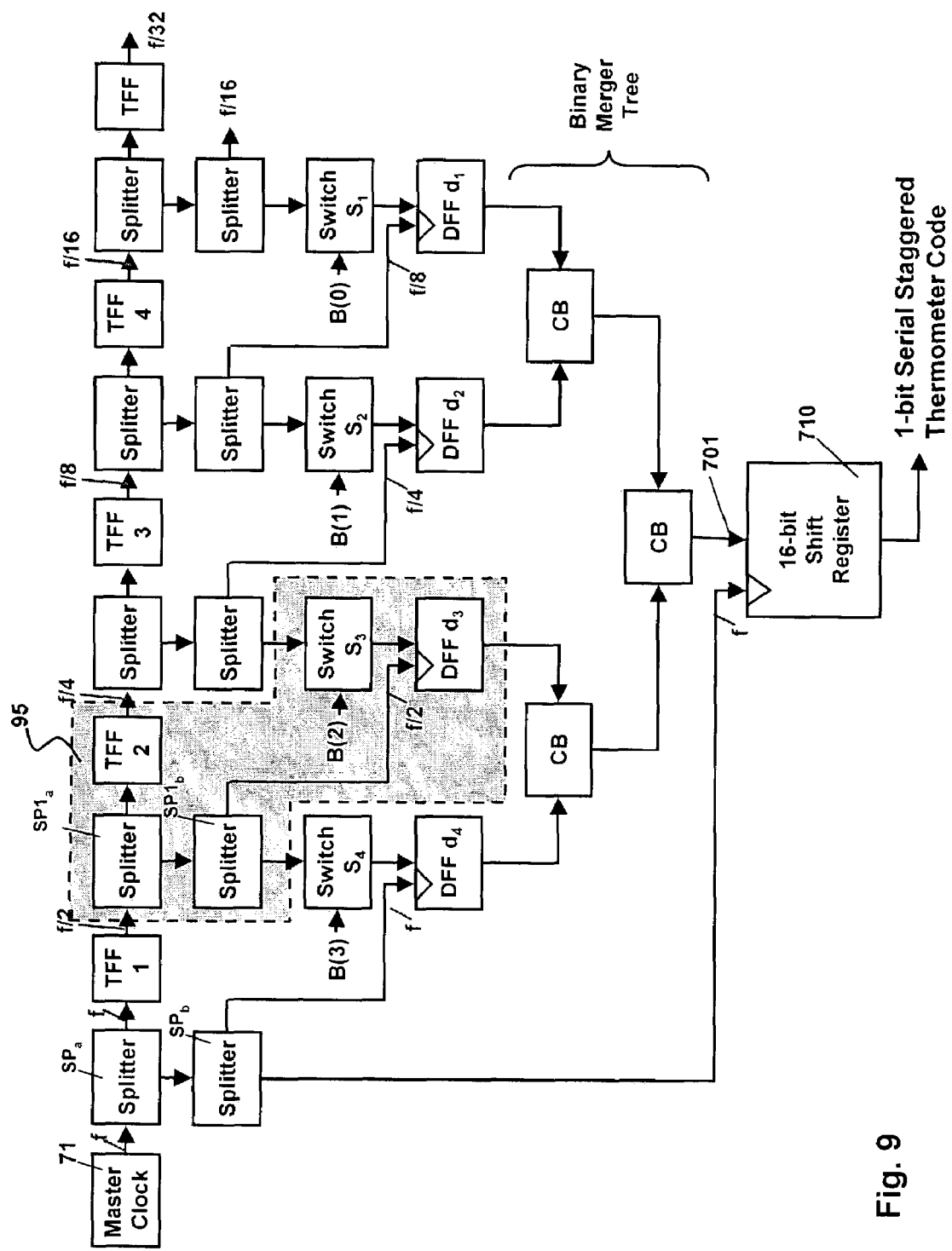
FIG. 9 is a detailed block diagram of a 4 bit staggered thermometer encoder circuit embodying the invention.

FIG. 9 is a more detailed schematic block diagram, which can be implemented using RSFQ superconducting circuitry, for converting a 4-bit binary number into a 1-bit serial frame of length $2^4$ in accordance with the invention. The circuit designed with a regular structure can be easily extended by repeating the shaded tile, 95. The different pulse streams are then merged with a binary tree of confluence buffers (CB) and passed through a shift register. FIG. 9 shows numerous splitters used to provide the same clocking signal to different circuit points. Thus the master clock 71 is coupled via splitter $SP_a$ to the input of TFF1 and to splitter $SP_b$. Splitter $SP_b$ then provides a clocking signal to DFF $d_4$ and to the clocking input of a shift register 710. FIG. 9 illustrates that the circuit may be designed with a regular structure which can be easily extended by repeating the components shown in box 95. The different pulse streams at the outputs of the switches ($S_1$-$S_4$) are then merged with a binary tree of confluence buffers (CB) and passed through to a shift register 710. The top row of the FIG. 9 shows a chain of toggle flip-flops, punctuated by splitters, for dividing the master clock stream by factors of 2. The splitter provides access to these pulse streams of different frequencies (the master clock and its binary sub-harmonics). To implement the location assignment algorithm described above, D-flip-flop cells (detailed in FIG. 11) may be used to provide the right delay. A tree of asynchronous merger or confluence buffer cells (see FIGS. 15a and 15b) may be used to merge these different pulse streams ensuring the same path delay. The data is then synchronized in a shift register which may be of the type shown in FIGS. 12a and 12b. Some of the RSFQ cells mentioned above are described in more detail below.

Figure 10:
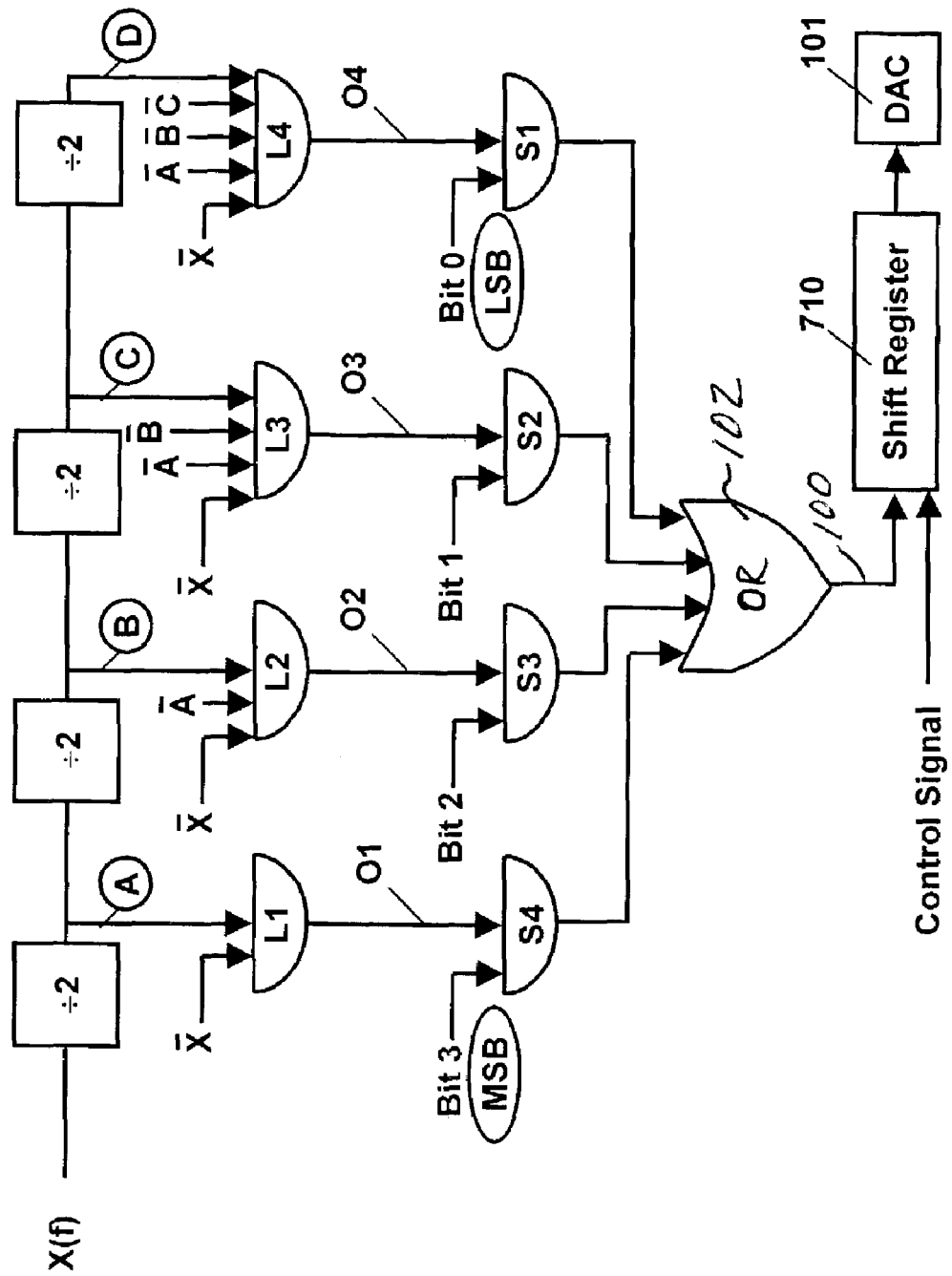
FIGS. 10 and 10A are, respectively, a block diagram of circuitry embodying the invention, and a waveform diagram for operating the circuitry of FIG. 10 in accordance with the invention.
Figure 10A:
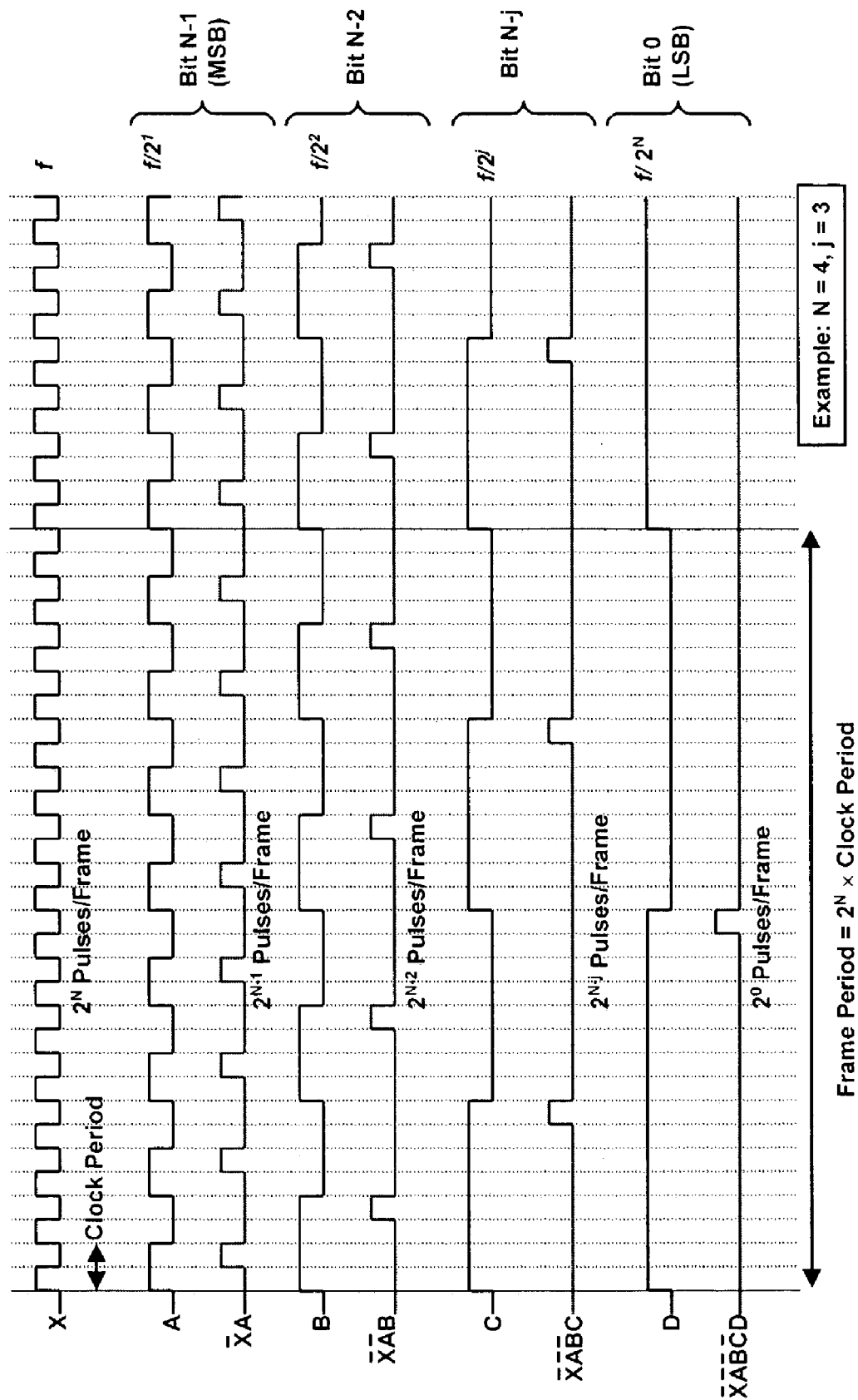

FIGS. 10 and 10A illustrate a circuit arrangement in which frequency signals derived from a clock (X) of frequency, f, are logically combined (gated) to generate pulses occupying unique time slots. The bits of a binary number can then be converted into a serial stream of pulses which are readily interleaved in accordance with the invention. Referring to FIG. 10 there is shown a clock X of frequency f applied to a series of four divide by two flip-flops. [This is by way of example only; it should be understood that many more stages may be used to correspond to the number of bits to be converted]. FIG. 10A shows the outputs (A, B, C D) produced using the four divide-by-two flop-flops. Each one of the outputs A, B, C D can then be modified using relatively simple logic gates (L1, L2, L3, L4) to produce unique outputs (O1, O2, O3, O4). The output O1 is obtained using L1 by logically "and' ing" A and X-not. The output O2 is obtained using L2 by logically "and'ing" B with X-not and A-not. The output O3 is obtained using L3 by logically "and'ing" C with X-not, A-not and B-not. The output O4 is obtained using L4 by logically "and'ing" D with X-not, A-not, B-not and C-not. An examination of FIG. 10A shows that the 8 pulses/cycle at O1, the 4 pulses/cycle at O2, the 2 pulses/cycle at O3 and the 1 pulse/cycle at O4 occur at different times. That is, each pulse has a different time slot during each frame or clocking period.

Each output (O1, O2, O3, O4) is coupled via a corresponding switch (S4, S3, S2, S1) to an OR gate 102 whose output is connected to an output bus 100. In its simplest form the outputs of the switches could be connected directly to output bus which would then function as a virtual-OR. That is, assuming each one of the switches (S1, S2, S3, S4) to be turned on, the 15 pulses from O1, O2, O3 and O4 would be produced on line 100. In FIG. 10, line 100 is shown connected to the input of a shift register 710 whose output is connected to the input of a digital-to-analog converter (DAC) 101. The pulses on line 100 would then be clocked into the shift register 710 by means of a control signal and could be stored in the register until the control signal advances or "outputs" the pulses contained in the shift register into DAC 101.

Alternatively, line 100 could be directly connected to the DAC, eliminating the need for a shift register.

As noted above, converting an N-bit number into an equivalent serial stream of one-bit pulses enables the use of a simple structure to convert a binary number into an analog voltage. In addition, a staggered (interleaved) thermometer encoder embodying the invention provides noise shaping (quantization noise power increases at higher frequencies away from the synthesized single tone) and predictably concentrates power more in the integral submultiples of the clock frequency. Thus enabling noise and any unwanted signals to be more easily filtered.

As noted above, circuits embodying the invention may be composed of simple RSFQ cells of the type shown in FIGS. 11, 12, 13, 14 and 15.

Figure 11A:
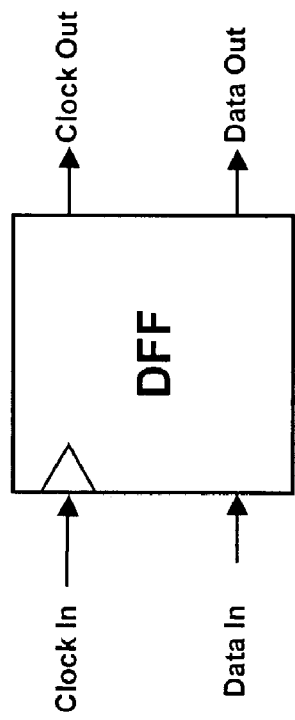
FIGS. 11(*a*) and 11(*b*) are, respectively, a symbolic representation of a D-flip flop and its circuit schematic.
Figure 11B:
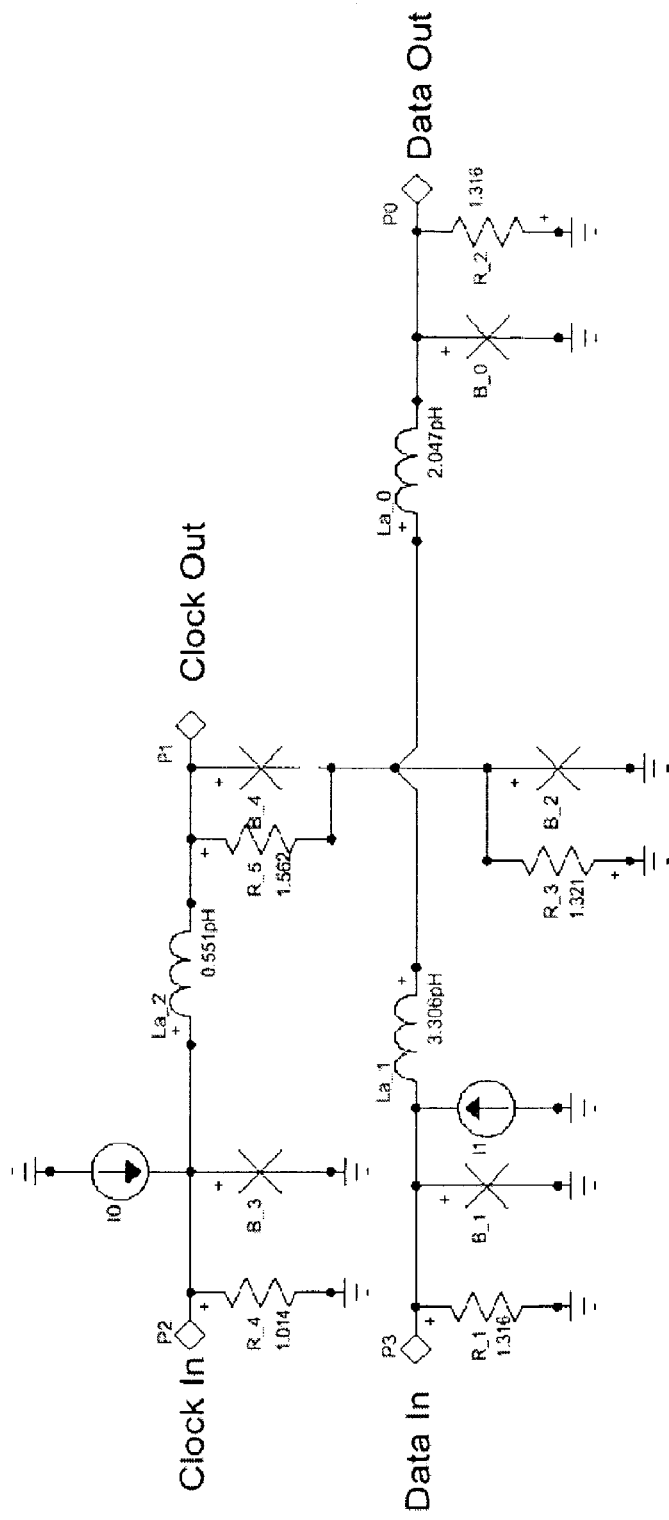

The D-type flip flop (DFF) cell shown in FIGS. 11(a) and 11(b) may be used as a digital delay element. An SFQ pulse arriving at the 'data Input' sets the flip-flop to the '1' state. An output pulse is produced at the "Data Output' upon the subsequent arrival of an SFQ pulse at the 'Clock Input', which also propagates to the 'Clock Output'. These DFF cells may be concatenated to form a shift register 710 of the type shown in FIGS. 12a and 12b.

Figure 13A:
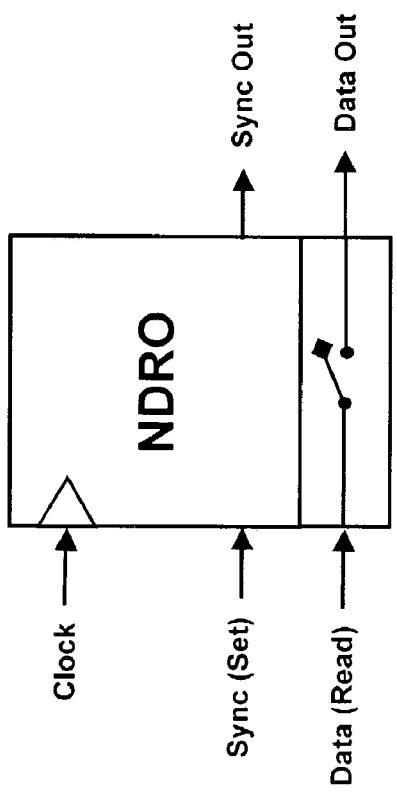
FIGS. 13(*a*) and 13(*b*) are, respectively, the symbolic representation of an NDRO cell and its circuit schematic suitable for use as a switch in circuits embodying the invention.
Figure 13B:
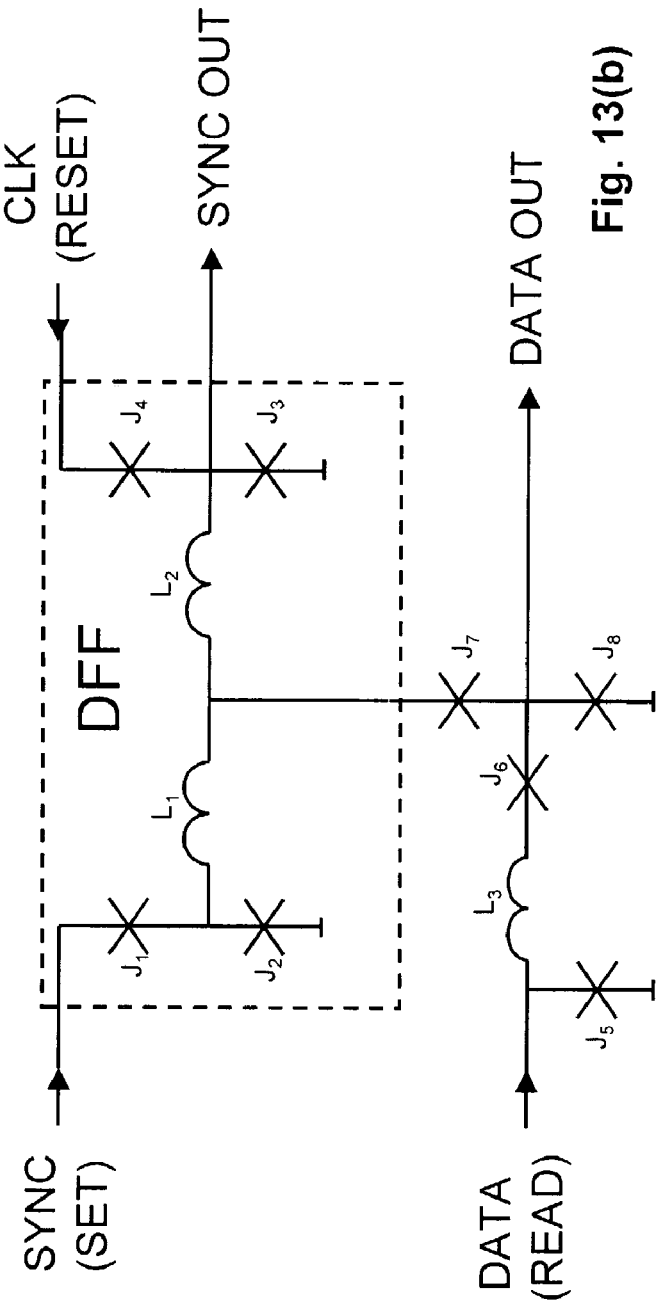

The DFF cell of FIGS. 11(a) and 11(b) can be modified to form a non-destructive readout (NDRO) cell, of the type shown in FIGS. 13(a) and 13(b), that can function as a switch. Thus, devices suitable for performing the switching function (S1-Sn) may be of the type shown in block form in FIG. 13(a) and schematically in FIG. 13(b). An SFQ pulse applied to the SYNC input sets the DFF to the '1' state. While it is in the '1' state, any pulse applied to the DATA input will be read out and an SFQ pulse will be produced at the output. This corresponds to the 'ON' (closed or turned-on) state of the switch. If a pulse is applied to the CLK input, the DFF is reset to the '0' state. While it is in the '0' state, any pulse applied to the DATA input will escape through J6 and no SFQ pulse will be produced at the output. This corresponds to the 'OFF' (open or turned-off) state of the switch.

A set of NDRO cells may also be used to act as a shift register to store the binary bits that can be loaded serially and can then be used to selectively activate the switches.

The switches (S1-Sn) may be formed using NDRO type switches, as shown in FIGS. 13a, 13b. In the NDRO type switch, a corresponding binary bit is stored for non-destructive read out (NDRO) and the SFQ pulse stream is allowed to pass through only if the stored bit is a '1'. Alternatively, a simple dc switch may be used with a dc current being applied to the switch to turn it on to let pulses propagate through.

A bit from the n-bit word may be applied to the SYNC input and the frequency signals corresponding to that bit are applied to the DATA READ input. When the bit has a value of a logic "1", the DFF stores an SFQ pulse as a circulating current in the loop J2-L1-L2-J3, and applies a phase bias across $J_7$ and $J_8$. If it is in this state, when an SFQ pulse is applied to the DATA READ input, J8 switches to produce an output pulse on DATA OUT. When the bit has a value of a logic "0", there is no phase bias across $J_7$ and $J_8$. If it is in this state, when an SFQ pulse is applied to the DATA READ input, $J_6$ switches before $J_8$ and no output pulse is produced on DATA OUT.

A suitable toggle flip-flop (TFF) circuit is shown in block form in FIG. 14(a) and schematically in FIG. 14(b). A pulse arriving at the input alters the state of the flip-flop (from '0' to '1' or from '1' to '0'). A sequence of pulses alternately sets and resets the flip-flop, producing a pulse at the output for every other input pulse. Thus this circuit can work as a binary frequency divider.

A confluence buffer of the type shown in block form in FIG. 15(a) and schematically in FIG. 15(b) includes an asynchronous two (or more) input OR gate that produces an SFQ pulse at the output every time a pulse arrives at either input.

What is claimed is:

1. A combination comprising:
    a high power amplifier (HPA) for transmitting an RF modulated signal said HPA having an input port and an output port, and said HPA being subject to introducing distortions into the transmitted signals produced at its output port;
    means for receiving digital baseband signals;
    means responsive to said digital baseband signals for digitally up-converting the baseband signals and generating digital signals defining a digital RF waveform corresponding to the baseband signals; and
    a digital RF predistorter circuit responsive to the digital signals defining the digital RF waveform and to one of (a) a digitally sampled signal derived from the output of the HPA and (b) stored data pertaining to the characteristics of the HPA, for directly operating on and modifying consecutive digital signal samples defining the digital RF waveform on a point by point basis; and
    means for coupling the modified digital signals defining the digital RF waveform to the input port of the HPA for linearizing the response of the HPA and producing an output signal at the output port of the HPA which tends to be a linear function of the baseband signals.

2. The combination as claimed in claim 1, wherein the digital RF predistorter circuit has a signal input port, a signal output port, and a control port; wherein means couple the digital RF waveform to the signal input port of the digital RF predistorter circuit; wherein means including a digital-to-analog converter (DAC) couples the output port of the digital RF predistorter circuit to the input port of the HPA; and wherein said one of (a) a digitally sampled signal derived from the output of the HPA and (b) stored data pertaining to the characteristics of the HPA, is coupled to the control port of the digital RF predistorter circuit.

3. The combination as claimed in claim 2 wherein the signal at the output port of the digital RF predistorter circuit is a multi-bit signal, and wherein the DAC includes a high speed encoder operable at RF frequencies greater than the RF waveform for converting the multi-bit signal to a single-bit stream of pulses and also includes a single-bit digital to analog converter coupled to the encoder for converting the single-bit serial stream of pulses to an analog voltage.

4. The combination as claimed in claim 2 wherein the means responsive to said baseband signals for digitally up-converting the baseband signals and generating the digital signals defining a digital RF waveform corresponding to the baseband signals includes means for generating a digital RF waveform which is a multi-bit signal; wherein the means coupling the digital RF waveform to the signal input port of the digital RF predistorter circuit includes an encoder circuit operable at higher frequencies than the RF waveform for converting the multi-bit signal to a single-bit serial pulse stream of pulses; and wherein said DAC includes a single-bit digital-to-analog converter for producing an analog voltage coupled to the input port of the HPA.

5. The combination as claimed in claim 2, wherein the digital RF predistorter circuit is formed of superconductive circuit components.

6. The combination as claimed in claim 2 wherein said means coupling the output port of the digital RF predistorter circuit to the input port of the HPA includes an encoder operable at higher frequencies than the RF waveform for converting multi-bit signals present at the output port of the digital RF predistorter circuit into a serial stream of one-bit pulses.

7. The combination as claimed in claim 1, wherein the digital RF predistorter circuit has a signal input port, a signal output port, and a control port; wherein the digital RF waveform is applied to the signal input port of the digital RF predistorter circuit; wherein digital-to-analog converting means couple the output port of the digital RF predistorter circuit to the input port of the HPA; and wherein the digital RF predistorter circuit includes stored data pertaining to the characteristics of the HPA and wherein said stored data is responsive to signals from the digital RF waveform for supplying modifying signals to the control port of the digital RF predistorter circuit for producing an output signal at the output port of the HPA which tends to be a linear function of the baseband signals.

8. The combination as claimed in claim 7, wherein said digital to analog converting means coupling the output port of the digital RF predistorter circuit to the input port of the HPA includes an encoder operable at higher frequencies than the RF waveform for converting multi-bit signals present at the output port of the digital RF predistorter circuit into a serial stream of one-bit pulses.

9. The combination as claimed in claim 1 wherein said baseband signals are digital baseband data signals and wherein said means responsive to said baseband signals for digitally up-converting the baseband signals and generating digital signals defining a digital RF waveform corresponding to the baseband signals includes a digital local oscillator for generating multi-bit signals and encoding means operable at higher frequencies than the RF waveform for converting the multi-bit signals to a corresponding serial stream of single-bit pulses.

10. The combination as claimed in claim 9 wherein the digital RF predistorter circuit modifies the serial stream of single-bit pulses.

11. A combination as claimed in claim 1, wherein the digital RF waveform is referred to herein as a T(s) signal, wherein T(s) is a digitally sampled signal at a predetermined frequency; and
    wherein said digital RF predistorter circuit is responsive to the T(s) signal, and to one of (a) a signal derived from the output of the HPA and (b) stored data pertaining to the characteristics of the HPA, for modifying the T(s) signal and for coupling the modified T(s) signal to the input port of the HPA for linearizing the response of the HPA and producing an output signal at the output port of the HPA which tends to be a linear function of the baseband signals.

12. The combination as claimed in claim 11, wherein the digital RF predistorter circuit has a signal input port, a signal output port, and a control port; wherein the T(s) signal is applied to the signal input port of the digital RF predistorter circuit; wherein means couple the output port of the digital RF predistorter circuit to the input port of the HPA; and wherein the output port of the HPA is coupled to the control port of the digital RF predistorter circuit for applying a feedback signal thereto.

13. The combination as claimed in 12, wherein the digital RF predistorter circuit includes means for comparing the digital T(s) signal with a digital signal derived from the output of the HPA and for generating predistortion signals for modifying the T(s) signal applied to the input port of the HPA.

14. The combination as claimed in claim 12, wherein the digital RF predistorter circuit includes digital encoding operable at higher frequencies than the RF waveform means for converting multi-bit signals into a serial single-bit stream.

15. The combination as claimed in claim 14 wherein the means for digitally up-converting the baseband signals produce multi-bit signals and wherein the digital encoding means includes superconductive circuitry for converting each multi-bit signal produced at the output of the up-converter into a one-bit serial pulse stream.

16. The combination as claimed in claim 11, wherein the digital RF predistorter circuit is formed using ultra-high speed superconducting electronics (SCE) to perform digital predistortion for correction and linearization directly on the digital signals defining the RF waveform to improve linearity and increase the dynamic range of the HPA.

17. A combination comprising:
a high power amplifier (HPA) for transmitting an RF modulated signal, said HPA having an input port and an output port, and said HPA being subject to introducing distortions into the transmitted signals produced at its output port;
means for receiving baseband signals;
means responsive to said baseband signals for digitally up-converting the baseband signals and generating digital signals defining a digital RF waveform corresponding to the baseband signals, where this digital RF waveform is referred to herein as a T(s) signal; and
a digital RF predistorter circuit having an input port, an output port and a control port;
means for applying the T(s) signal to the signal input port of the digital RF predistorter;
means for coupling the output port of the digital RF predistorter to the in put port of the HPA; and
means for applying signals to the control port of the digital RF predistorter circuit operable at higher frequencies than the RF waveform for causing the digital RF predistorter circuit to directly operate on, and modify, consecutive the digital signals samples within said T(s) signal and for causing a modified T(s) signal to be applied to the input port of the HPA modifying the waveform on a point by point basis for linearizing the response of the HPA and reducing distortions in the transmitted signals.

18. The combination as claimed in claim 17, wherein said means for applying signals to the control port of the digital RF predistorter circuit includes means responsive to the signal T(s) and to stored data pertaining to the HPA for modifying the signal T(s).

19. The combination as claimed in claim 17, wherein said means for applying signals to the control port of the digital RF predistorter circuit includes means responsive to the signal T(s) and to a signal derived from the output of the HPA for comparing these signals and producing a feedback signal to the control port of the digital RF predistorter circuit.

20. The combination as claimed in claim 17, wherein the means coupling the output port of the digital RF predistorter to the input port of the HPA includes encoding means and a digital to analog converter (DAC); and wherein the means for coupling the output port of the HPA to the control port of the digital RF predistorter includes an analog to digital converter.

21. The combination as claimed in claim 17, wherein the encoding means and the DAC are formed using superconducting electronics.

22. The combination as claimed in claim 17 wherein the digital RF predistorter circuit includes a look-up table containing stored data pertaining to the characteristics of the HPA.

23. A combination comprising:
a high power amplifier (HPA) for transmitting an RF modulated signal said amplifier having an input port and an output port, said amplifier being subject to introducing distortions into the transmitted signals;
means for receiving digital baseband signals;
digital up-converting means, including a local oscillator, responsive to said baseband signals for processing said baseband signals and generating digital signals defining a desired digital RF waveform T(s); where T(s) is a digitally sampled signal at a predetermined frequency;
digital predistorter circuitry having an input port, an output port and a control port;
means for supplying the digital signals defining the desired digital RF waveform T(s) to the input port of the digital predistorter circuitry and means for supplying signals to the control port of the digital predistorter circuitry for modifying consecutive digital signal samples and modifying the waveform on a point by point by point basis for producing a predistorted digital RF waveform P(s)T(s) at the output port of the digital predistorter circuitry; and
means for applying P(s)T(s) to the input port of the HPA for producing an output signal which tends to be a linear function of the baseband signals.

24. The combination as claimed in claim 23 wherein the digital predistorter circuitry includes means for sensing and sampling the transmit waveform T(s) and means for sensing the output waveform at the output port of the HPA for comparing the transmit and output waveforms and for directly adding or subtracting predistorter signals onto the transmit waveform.

25. The combination as claimed in claim 23 wherein the digital predistorter circuitry includes a look up table containing previously obtained and stored data and means for sensing and sampling the transmit waveform T(s) and the output waveform for accessing the look up table and deriving signals used to modify the transmit waveform T(s).

26. The combination as claimed in claim 25 including means for dynamically updating the look up table.

27. The combination as claimed in claim 23 wherein the digital predistorter circuitry includes a predistortion calculator and means for sensing and sampling the transmit waveform T(s) and applying signals responsive thereto to the predistortion calculator which, based on the pattern of the transmit waveform and prior knowledge of the transfer function of the HPA, adds or subtracts distortion signals onto the transmit waveform as it is processed in the predistorter circuitry.

28. The combination as claimed in claim 23 wherein the digital up-converting means and the digital predistorter are formed using superconducting electronics.

29. The combination as claimed in claim 28, wherein the combination includes a source of clocking signals coupled to the digital predistorter circuitry for synchronizing the operation of the circuitry.

30. A combination comprising:
a high power amplifier (HPA) for transmitting an RF modulated signal said amplifier having an input port and an output port, said HPA being subject to introducing distortions into the transmitted signals;
means for receiving baseband signals;
means responsive to said baseband signals for digitally up-converting the baseband signals and generating digital signals defining a corresponding digital RF waveform representation of the baseband signals, defined herein as T(s); and
a digital RF predistorter circuit having an input port, an output port and a control port; and
means for applying said T(s) signal to the input port of the digital RF predistorter circuit operable at much higher frequencies than the RF waveform and means for applying a signal representative of preselected characteristics of the HPA to the control port of the digital RF predistorter circuit for directly operating on, and modifying, consecutive digital signal samples of the T(s) signal and modifying the waveform on a point by point basis; and
means for coupling the output port of the digital RF predistorter circuit to the input of the HPA for applying the modified signal to the input of the HPA and for linearizing the response of the HPA and minimizing distortions in the transmitted signal.

* * * * *